US012040006B2

(12) United States Patent
Young et al.

(10) Patent No.: US 12,040,006 B2
(45) Date of Patent: Jul. 16, 2024

(54) MEMORY ARRAY INCLUDING DUMMY REGIONS

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Chao-I Wu, Zhubei (TW); Sheng-Chen Wang, Hsinchu (TW); Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/815,032

(22) Filed: Jul. 26, 2022

(65) Prior Publication Data

US 2022/0358984 A1 Nov. 10, 2022

Related U.S. Application Data

(62) Division of application No. 17/064,279, filed on Oct. 6, 2020, now Pat. No. 11,532,343.

(Continued)

(51) Int. Cl.

*G11C 11/22* (2006.01)
*H10B 43/27* (2023.01)

(Continued)

(52) U.S. Cl.

CPC ........ *G11C 11/2257* (2013.01); *G11C 11/223* (2013.01); *G11C 11/2255* (2013.01);

(Continued)

(58) Field of Classification Search

CPC ........ H10B 43/27; H10B 51/10; H10B 51/20; H10B 51/30; G11C 11/223; G11C 11/2253; G11C 11/2257

See application file for complete search history.

(56) References Cited

U.S. PATENT DOCUMENTS 8,203,884 B2 6/2012 Kito et al.
8,470,671 B1 6/2013 Lin et al.

(Continued)

FOREIGN PATENT DOCUMENTS

CN 102971797 A 3/2013
CN 103165617 A 6/2013

(Continued)

OTHER PUBLICATIONS

Wu, B. et al., "High aspect ration silicon etch: A review," J. Appl. Phys. 108, 051101 (2010) : https://doi.org/10.1063/1.3474652, Sep. 9, 2010, 21 pages.

(Continued)

*Primary Examiner* — Matthew E Warren
(74) *Attorney, Agent, or Firm* — Slater Matsil, LLP

(57) ABSTRACT

3D memory arrays including dummy conductive lines and methods of forming the same are disclosed. In an embodiment, a memory array includes a ferroelectric (FE) material over a semiconductor substrate, the FE material including vertical sidewalls in contact with a word line; an oxide semiconductor (OS) layer over the FE material, the OS layer contacting a source line and a bit line, the FE material being between the OS layer and the word line; a transistor including a portion of the FE material, a portion of the word line, a portion of the OS layer, a portion of the source line, and a portion of the bit line; and a first dummy word line between (Continued)

the transistor and the semiconductor substrate, the FE material further including first tapered sidewalls in contact with the first dummy word line.

20 Claims, 40 Drawing Sheets

Related U.S. Application Data

(60) Provisional application No. 63/044,596, filed on Jun. 26, 2020.

(51) Int. Cl.
*H10B 51/10* (2023.01)
*H10B 51/20* (2023.01)
*H10B 51/30* (2023.01)

(52) U.S. Cl.
CPC ............. *H10B 43/27* (2023.02); *H10B 51/10* (2023.02); *H10B 51/20* (2023.02); *H10B 51/30* (2023.02)

(56) References Cited

U.S. PATENT DOCUMENTS 9,015,561 B1 4/2015 Hu
9,240,420 B2 1/2016 Rabkin et al.
9,355,727 B1 5/2016 Zhang et al.
9,455,262 B2 9/2016 Widjaja
9,520,407 B2 12/2016 Fukuzumi et al.
9,601,497 B1 3/2017 Chen et al.
9,634,023 B2 4/2017 Lee
9,806,202 B2 10/2017 Yamazaki et al.
9,997,631 B2 6/2018 Yang et al.
10,043,819 B1 8/2018 Lai et al.
10,256,247 B1 4/2019 Kanakamedala et al.
10,515,981 B2 12/2019 Or-Bach et al.
10,777,566 B2 9/2020 Lue
10,868,042 B1 12/2020 Zhang et al.
10,998,447 B2 5/2021 Onuki et al.
11,011,529 B2 5/2021 Ramaswamy
11,152,386 B2 10/2021 Or-Bach et al.
11,171,157 B1 11/2021 Lai et al.
11,211,395 B2 12/2021 Lung
11,404,091 B2 8/2022 Lin et al.
11,423,966 B2 8/2022 Lin et al.
2006/0228859 A1 10/2006 Willer
2007/0072439 A1 3/2007 Akimoto et al.
2008/0265235 A1 10/2008 Kamigaichu et al.
2011/0266604 A1 11/2011 Kim et al.
2011/0298013 A1 12/2011 Hwang et al.
2013/0148398 A1 6/2013 Baek et al.
2013/0264631 A1 10/2013 Alsmeier et al.
2014/0048868 A1 2/2014 Kim et al.
2014/0264532 A1 9/2014 Dennison et al.
2014/0264718 A1 9/2014 Wada et al.
2015/0294977 A1 10/2015 Kim et al.
2015/0380418 A1 12/2015 Zhang et al.
2016/0012901 A1 1/2016 Hsu et al.
2016/0086970 A1 3/2016 Peng
2016/0086972 A1 3/2016 Zhang et al.
2016/0163389 A1 6/2016 Zhang et al.
2016/0181259 A1 6/2016 Van Houdt et al.
2016/0204117 A1 7/2016 Liu et al.
2016/0284811 A1 9/2016 Yu et al.
2016/0322368 A1 11/2016 Sun et al.
2017/0117290 A1 4/2017 Lee et al.
2017/0148517 A1 5/2017 Harari
2017/0213843 A1 7/2017 Choi
2017/0213846 A1 7/2017 Lee
2017/0236831 A1 8/2017 Kim
2017/0301684 A1 10/2017 Park et al.
2018/0083018 A1 3/2018 Yamakita et al.
2018/0130823 A1 5/2018 Kim
2018/0269210 A1 9/2018 Tezuka et al.
2018/0301415 A1 10/2018 Mizukami et al.
2018/0315794 A1 11/2018 Kamalanathan et al.
2018/0350837 A1 12/2018 Yoo et al.
2019/0027493 A1 1/2019 Kimura et al.
2019/0058109 A1 2/2019 Chen et al.
2019/0067325 A1 2/2019 Yano
2019/0102104 A1* 4/2019 Righetti ................ G06F 3/0688
2019/0123061 A1 4/2019 Liu
2019/0148286 A1 5/2019 Or-Bach et al.
2019/0148393 A1 5/2019 Lue
2019/0157291 A1 5/2019 Kam et al.
2019/0295626 A1 9/2019 Ikeda et al.
2019/0312050 A1 10/2019 Lai et al.
2019/0326308 A1 10/2019 Pu et al.
2020/0006433 A1 1/2020 Majhi et al.
2020/0013791 A1 1/2020 Or-Bach et al.
2020/0013799 A1 1/2020 Herner et al.
2020/0026990 A1 1/2020 Lue
2020/0035701 A1 1/2020 Huang et al.
2020/0058673 A1 2/2020 Nishikawa et al.
2020/0075631 A1 3/2020 Dong et al.
2020/0083248 A1 3/2020 Uchida
2020/0098774 A1 3/2020 Yeh et al.
2020/0105773 A1 4/2020 Morris et al.
2020/0111920 A1 4/2020 Sills et al.
2020/0119025 A1 4/2020 Jiang et al.
2020/0152653 A1 5/2020 Lu et al.
2020/0185409 A1* 6/2020 Baek ...................... H10B 43/10
2020/0185411 A1 6/2020 Herner et al.
2020/0194451 A1 6/2020 Lee et al.
2020/0203329 A1 6/2020 Kanamori et al.
2020/0227439 A1 7/2020 Sato
2020/0295033 A1* 9/2020 Sakamoto .............. H10B 41/27
2020/0303300 A1* 9/2020 Kato ................... H01L 23/5283
2020/0343252 A1 10/2020 Lai et al.
2020/0402890 A1* 12/2020 Chary ............... H01L 29/40117
2021/0036019 A1 2/2021 Sharangpani et al.
2021/0065805 A1* 3/2021 Choi ........................ G11C 7/22
2021/0066344 A1 3/2021 Son et al.
2021/0335805 A1 10/2021 Kai et al.
2021/0375847 A1 12/2021 Chibvongodze et al.
2021/0375917 A1 12/2021 Lu et al.
2021/0375927 A1 12/2021 Chia et al.
2021/0375932 A1 12/2021 Wang et al.
2021/0376153 A1 12/2021 Lu et al.
2021/0391355 A1 12/2021 Lill et al.
2021/0398593 A1 12/2021 Song et al.
2021/0407569 A1 12/2021 Young et al.
2021/0407845 A1 12/2021 Wang et al.
2021/0407980 A1 12/2021 Young et al.
2021/0408038 A1 12/2021 Lin et al.
2021/0408044 A1 12/2021 Chiang et al.
2021/0408045 A1 12/2021 Chiang et al.
2021/0408046 A1 12/2021 Chang et al.
2022/0005821 A1 1/2022 Or-Bach et al.
2022/0036931 A1 2/2022 Lin et al.
2022/0037253 A1 2/2022 Yang et al.
2022/0037361 A1 2/2022 Lin et al.
2022/0037362 A1 2/2022 Lin et al.

FOREIGN PATENT DOCUMENTS

CN 104112748 A 10/2014
CN 104170061 A 11/2014
CN 105359270 A 2/2016
CN 106158877 A 11/2016
CN 107871520 A 4/2018
CN 108401468 A 8/2018
CN 108962902 A 12/2018
CN 110114881 A 8/2019
CN 110268523 A 9/2019
CN 110416223 A 11/2019
CN 110520985 A 11/2019
CN 110800107 A 2/2020
CN 111048518 A 4/2020
JP 2007281199 A 10/2007
JP 2009016400 A 1/2009
JP 2017103328 A 6/2017

(56) References Cited

FOREIGN PATENT DOCUMENTS

| | | | | |
|---|---|---|---|---|
| JP | 2019504479 | A | | 2/2019 |
| KR | 20080096432 | A | | 10/2008 |
| KR | 20140024632 | A | | 3/2014 |
| KR | 20150118648 | A | | 10/2015 |
| KR | 20170089378 | A | | 8/2017 |
| KR | 20170093099 | A | | 8/2017 |
| KR | 20180126323 | A | | 11/2018 |
| KR | 20180131118 | A | | 12/2018 |
| KR | 20190057065 | A | | 5/2019 |
| KR | 20190058157 | A | | 5/2019 |
| TW | 201114021 | A | | 4/2011 |
| TW | 201205576 | A | | 2/2012 |
| TW | 201624708 | A | | 7/2016 |
| TW | 201803131 | A | | 1/2018 |
| TW | I643317 | B | | 12/2018 |
| TW | I643318 | B | | 12/2018 |
| TW | 201909386 | A | | 3/2019 |
| TW | 201913963 | A | | 4/2019 |
| TW | 201926642 | A | | 7/2019 |
| TW | 201931577 | A | | 8/2019 |
| TW | 201944543 | A | | 11/2019 |
| TW | I681548 | B | | 1/2020 |
| TW | I692038 | B | | 4/2020 |
| TW | 202029353 | A | | 8/2020 |
| WO | 2016093947 | A1 | | 6/2016 |
| WO | 2017091338 | A1 | | 6/2017 |
| WO | 2019125352 | A1 | | 6/2019 |
| WO | WO-2019125352 | A1 | * | 6/2019 |
| WO | 2019152226 | A1 | | 8/2019 |

OTHER PUBLICATIONS

Karouta, Fouad, “A practical approach to reactive ion etching” Journal of Physics D: Applied Physics, 47 (2014) 233501, 15 pages.

Park, J. et al., “A hybrid ferroelectric-flash memory cells,” J _ Appl. Phys. 116, 124512, Sep. 29, 2014, 8 pages.

* cited by examiner

MEMORY ARRAY INCLUDING DUMMY REGIONS

PRIORITY CLAIM AND CROSS-REFERENCE

This application is a divisional of U.S. patent application Ser. No. 17/064,279, filed on Oct. 6, 2020, and entitled "Memory Array Including Dummy Regions," now U.S. Pat. No. 11,532,343, issued Dec. 20, 2022, which claims the benefit of U.S. Provisional Patent Application No. 63/044,596, filed on Jun. 26, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories: volatile memories and non-volatile memories. Volatile memories include random access memory (RAM), which can be further divided into two sub-categories: static random access memory (SRAM) and dynamic random access memory (DRAM). Both SRAM and DRAM are volatile because they will lose the information they store when they are not powered.

On the other hand, non-volatile memories can keep data stored on them when they are not powered. One type of non-volatile semiconductor memory is ferroelectric random access memory (FeRAM or FRAM). Advantages of FeRAM include fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
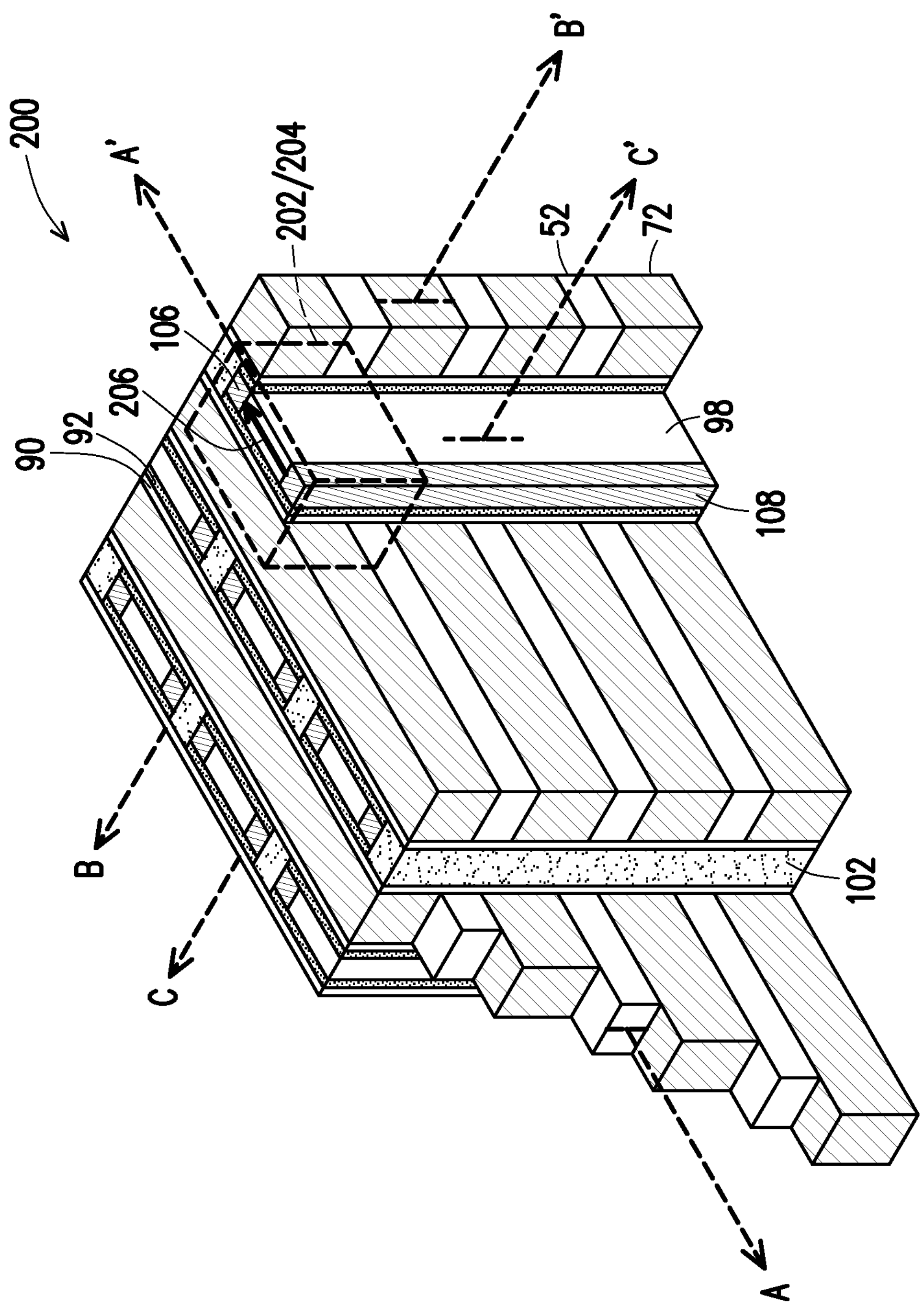
FIGS. 1A and 1B illustrate a perspective view and a circuit diagram of a memory array, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes a transistor having a word line region acting as a gate electrode, a bit line region acting as a first source/drain electrode, and a source line region acting as a second source/drain electrode. Each transistor further includes a ferroelectric (FE) gate dielectric layer and an oxide semiconductor (OS) channel region. The FE gate dielectric layers, the OS channel regions, the bit line regions, and the source line regions may be formed in recesses formed in the word line regions. Upper and lower regions of the recesses may have tapered sidewalls with widths which narrow in a direction toward a substrate over which the 3D memory array is formed, while middle regions of the recesses have sidewalls with substantially constant widths. Dummy memory layers may be formed in the top layers and bottom layers of the 3D memory array adjacent the tapered sidewalls, which reduces non-uniformity in the 3D memory array, reduces device defects, and improves device performance. The word line regions in the middle regions may be connected to conductive contacts such that functional memory devices are formed, while the word line regions in the upper and lower regions (e.g. the dummy memory layers) are not connected to conductive contacts and thus do not include functional memory devices.

Figure 1B:
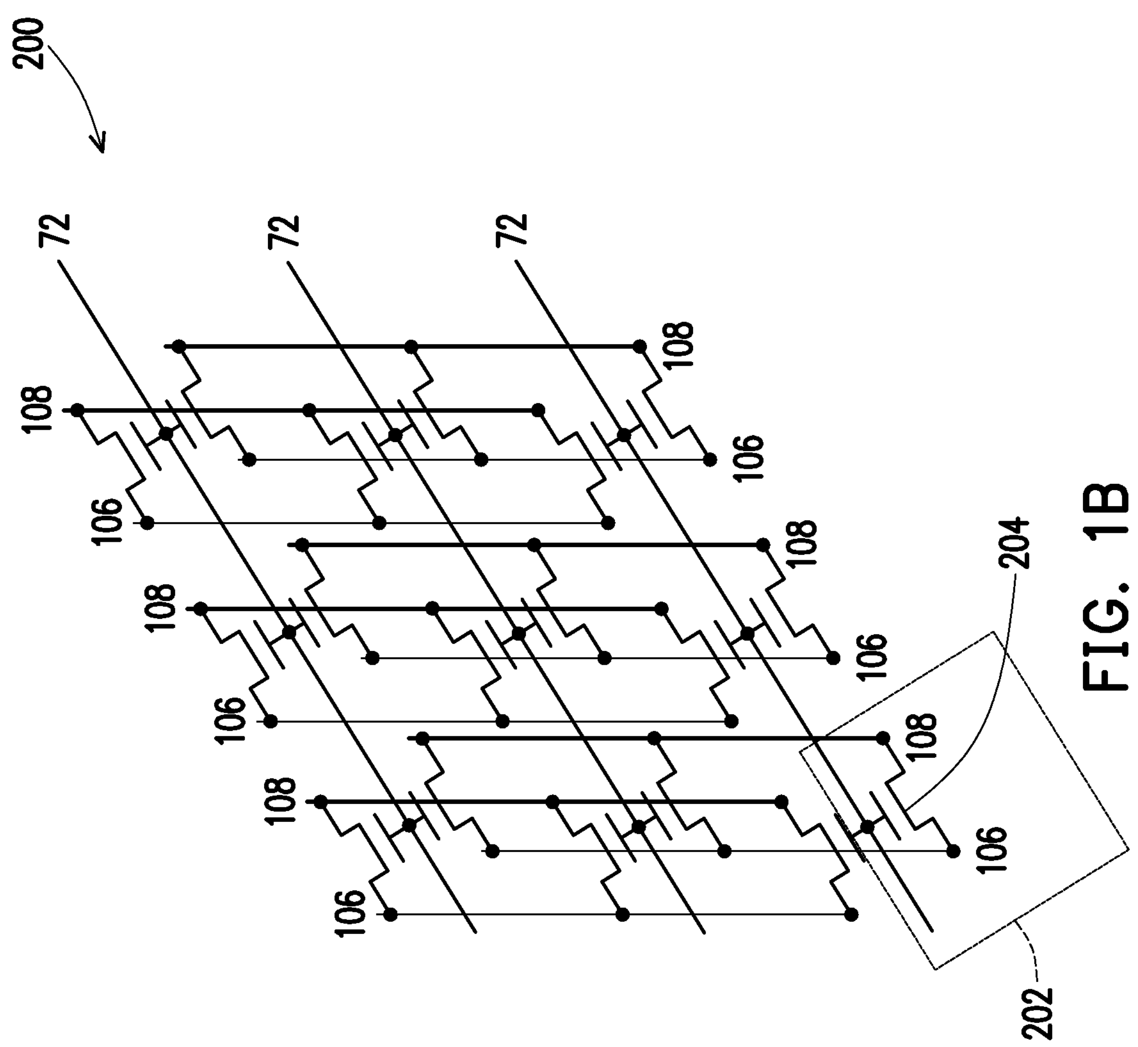

FIGS. 1A and 1B illustrate examples of a memory array 200, in accordance with some embodiments. FIG. 1A illustrates an example of a portion of the memory array 200 in a three-dimensional view and FIG. 1B illustrates a circuit diagram of the memory array 200. The memory array 200 includes a plurality of memory cells 202, which may be arranged in a grid of rows and columns. The memory cells 202 may be further stacked vertically to provide a three-dimensional memory array, thereby increasing device density. The memory array 200 may be disposed in the back end of line (BEOL) of a semiconductor die. For example, the memory array 200 may be disposed in the interconnect layers of the semiconductor die, such as above one or more active devices (e.g., transistors) formed on a semiconductor substrate.

In some embodiments, the memory array 200 is a flash memory array, such as a NOR flash memory array, or the like. Each of the memory cells 202 may include a transistor 204 with a ferroelectric (FE) material 90. The FE material 90 may serve as a gate dielectric. In some embodiments, a gate of each of the transistors 204 is electrically coupled to a respective word line (e.g., a conductive line 72), a first source/drain region of each of the transistors 204 is electrically coupled to a respective bit line (e.g., a conductive line 106), and a second source/drain region of each of the transistors 204 is electrically coupled to a respective source line (e.g., a conductive line 108). The respective source lines may electrically couple each of the second source/drain regions to ground. The memory cells 202 in a same horizontal row of the memory array 200 may share a common word line, while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not separately illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of the conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines) and a plurality of conductive lines 108 (e.g., source lines). The conductive lines 106 and the conductive lines 108 may each extend in a direction perpendicular to the conductive lines 72. Second dielectric materials 102 are disposed between and isolate adjacent ones of the conductive lines 106 and the conductive lines 108. A conductive line 106, an adjacent conductive line 108, and an intersecting conductive line 72 define a boundary of each of the memory cells 202, and first dielectric materials 98 are disposed between and isolate adjacent memory cells 202. In some embodiments, the conductive lines 108 are electrically coupled to ground. Although FIG. 1A illustrates a particular placement of the conductive lines 106 relative the conductive lines 108, it should be appreciated that the placement of the conductive lines 106 and the conductive lines 108 may be flipped.

The memory array 200 may also include oxide semiconductor (OS) layers 92. The OS layers 92 may provide channel regions for the transistors 204 of the memory cells 202. For example, when an appropriate voltage (e.g., a voltage greater than a threshold voltage ($V_{th}$) of a transistor 204) is applied to a transistor 204 through a corresponding conductive line 72, a region of the corresponding OS layer 92 adjacent the conductive line 72 may allow current to flow from a corresponding conductive line 106 to a corresponding conductive line 108 (e.g., in the direction indicated by arrow 206).

FE materials 90 are disposed between the conductive lines 72 and the OS layers 92. The FE materials 90 may provide gate dielectrics for the transistors 204. Accordingly, the memory array 200 may also be referred to as a ferroelectric random access memory (FERAM) array. The FE materials 90 may be polarized in one of two different directions. The polarization direction of the FE materials 90 may be changed by applying an appropriate voltage differential across the FE materials 90 and generating an appropriate electric field. The polarization may be relatively localized (e.g., generally contained within the boundaries of each of the memory cells 202) and the FE materials 90 may extend continuously across a plurality of the memory cells 202. A threshold voltage of a particular transistor 204 varies depending on the polarization direction of a corresponding region of the FE materials 90. As such, a digital value (e.g., a 0 or a 1) can be stored in the transistor 204 depending on the polarization direction of the corresponding region of the FE materials 90. For example, when a region of the FE materials 90 has a first electrical polarization direction, the corresponding transistor 204 may have a relatively low threshold voltage and when the region of the FE materials 90 has a second electrical polarization direction, the corresponding transistor 204 may have a relatively high threshold voltage. The difference between the two threshold voltages may be referred to as a threshold voltage shift. A larger threshold voltage shift makes it easier (e.g., less prone to error) to read the digital value stored in the corresponding memory cell 202.

To perform a write operation on a memory cell 202, a write voltage is applied across a region of the FE materials 90 corresponding to the memory cell 202. The write voltage can be applied, for example, by applying appropriate voltages to a corresponding conductive line 72 (e.g., a corresponding word line), a corresponding conductive line 106 (e.g., a corresponding bit line), and a corresponding conductive line 108 (e.g., a corresponding source line). By applying the write voltage across the region of the FE materials 90, a polarization direction of the region of the FE materials 90 can be changed. As a result, the threshold voltage of the corresponding transistor 204 is switched from a low threshold voltage to a high threshold voltage or from a high threshold voltage to a low threshold voltage, and a digital value can be stored in the memory cell 202. Because the conductive lines 72 extend in a direction perpendicular to the conductive lines 106 and the conductive lines 108, individual memory cells 202 may be selected for the write operation.

To perform a read operation on the memory cell 202, a read voltage (e.g., a voltage between the low threshold voltage and the high threshold voltage) is applied to the corresponding conductive line 72 (e.g., the corresponding word line). Depending on the polarization direction of the corresponding region of the FE materials 90, the transistor 204 of the memory cell 202 may or may not be turned on. As a result, the conductive line 106 may or may not be discharged through the conductive line 108 (e.g., the source line, which may be coupled to ground), and the digital value stored in the memory cell 202 can be determined. Because the conductive lines 72 extend in a direction perpendicular to the conductive lines 106 and the conductive lines 108, individual memory cells 202 may be selected for the read operation.

FIG. 1A further illustrates reference cross-sections of the memory array 200 that are used in later figures. Cross-section A-A' is along a longitudinal axis of conductive lines 72 and in a direction, for example, parallel to the direction of current flow across the OS layers 92 of the transistors 204. Cross-section B-B' is perpendicular to the cross-section A-A', the longitudinal axis of the conductive lines 72, and a longitudinal axis of conductive lines 106 and conductive lines 106. The cross-section B-B' extends through the first dielectric materials 98 and the second dielectric materials 102. Cross-section C-C' is parallel to the cross-section B-B' and extends through the conductive lines 106. Subsequent figures refer to these reference cross-sections for clarity.

FIGS. 2 through 27 are views of intermediate stages in the manufacturing of the memory array 200, in accordance with some embodiments. FIGS. 15 through 22, 23A, 24, 25A, 26, and 27 are illustrated along reference cross-section A-A' illustrated in FIG. 1. FIGS. 2 through 9, 10B, 11B, 12B, 13B, 14B, 23B, and 25B are illustrated along reference cross-section B-B' illustrated in FIG. 1. FIGS. 13C, 14C, and 23C, and 25C are illustrated along reference cross-section C-C' illustrated in FIG. 1. FIGS. 10A, 11A, 12A, 13A, and 14A illustrate a top-down view. FIG. 25D illustrates a perspective view.

Figure 2:
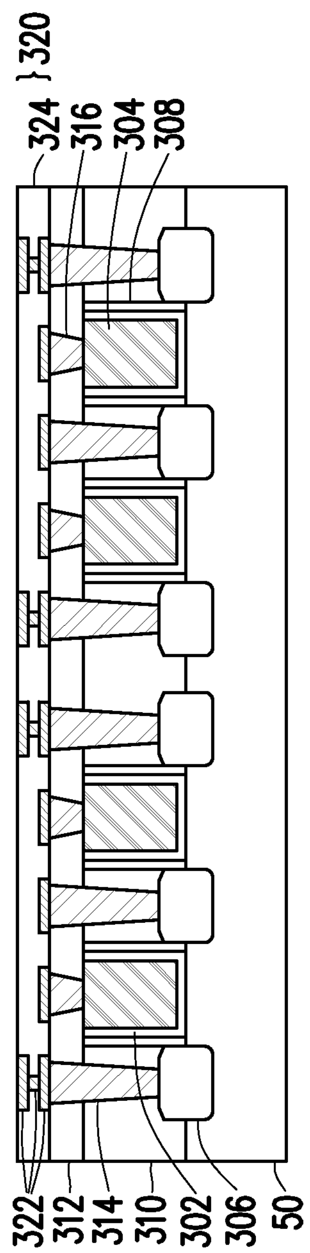
FIGS. 2, 3, 4, 5, 6, 7, 8, 9, 10A, 10B, 11A, 11B, 12A, 12B, 13A, 13B, 13C, 14A, 14B, 14C, 15, 16, 17, 18, 19, 20, 21, 22, 23A, 23B, 23C, 24, 25A, 25B, 25C, 25D, 26, and 27 are cross-sectional, top-down, and perspective views of intermediate stages in the manufacturing of memory arrays, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, which is typically a silicon or glass substrate. Other substrates, such as a multi-layered or gradient substrates may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may comprise fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first ILD 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320, including one or more stacked dielectric layers 324 and conductive features 322 formed in the one or more dielectric layers 324, is over the second ILD 312, the source/drain contacts 314, and the gate contacts 316. The interconnect structure 320 may be electrically connected to the gate contacts 316 and the source/drain contacts 314 to form functional circuits. In some embodiments, the functional circuits formed by the interconnect structure 320 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:
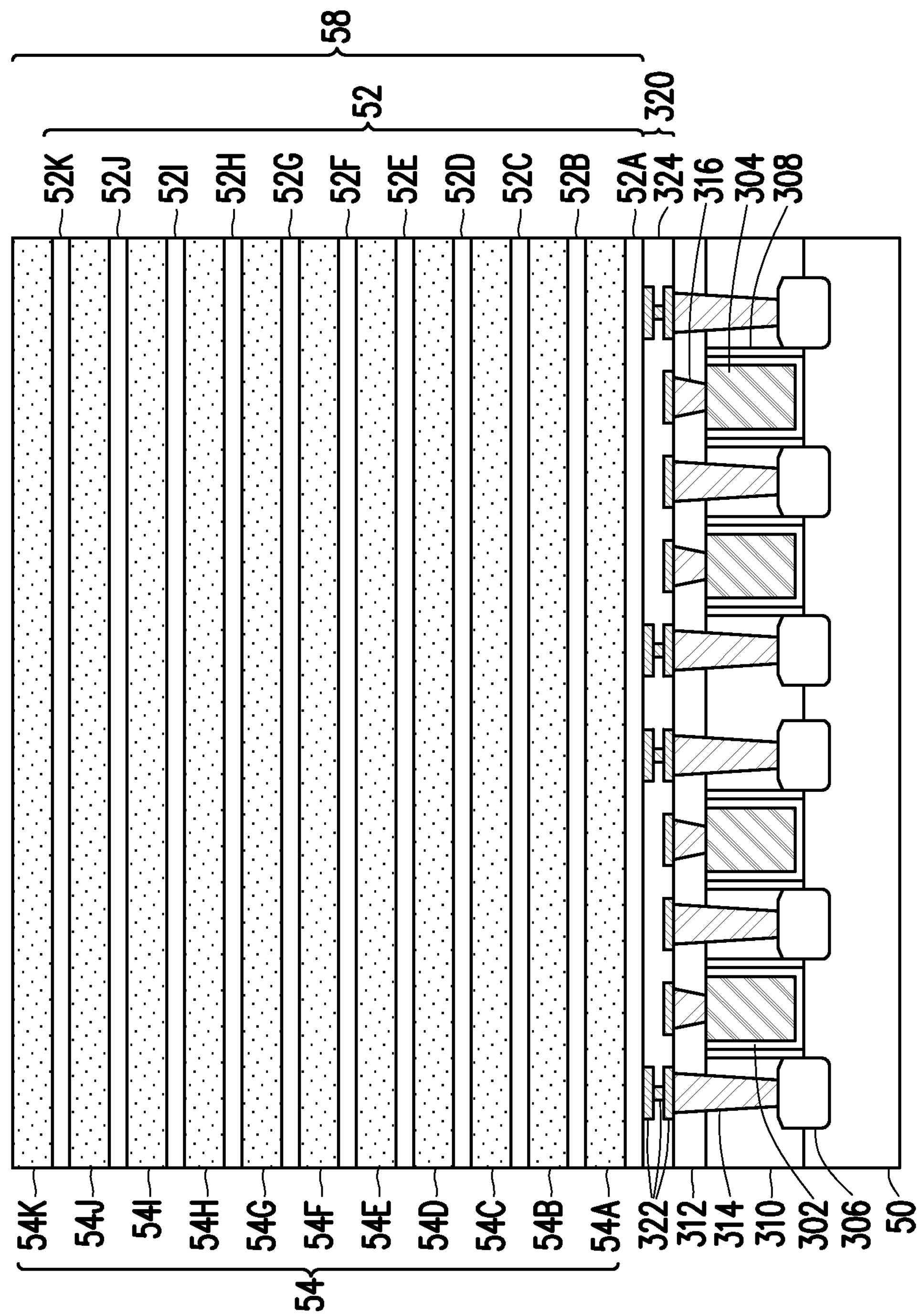

In FIG. 3, a multi-layer stack 58 is formed over the structure of FIG. 2. The substrate 50, the transistors, the ILDs, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of dielectric layers 52A-52K (collectively referred to as dielectric layers 52) and conductive layers 54A-54K (collectively referred to as conductive layers 54). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and the dielectric layers 52 may be each formed using, for example, chemical vapor deposition (CVD), atomic layer deposition (ALD), physical vapor deposition (PVD), plasma enhanced CVD (PECVD), or the like. Although FIG. 3 illustrates a particular number of the conductive layers 54 and the dielectric layers 52, other embodiments may include a different number of the conductive layers 54 and the dielectric layers 52.

Figure 4:
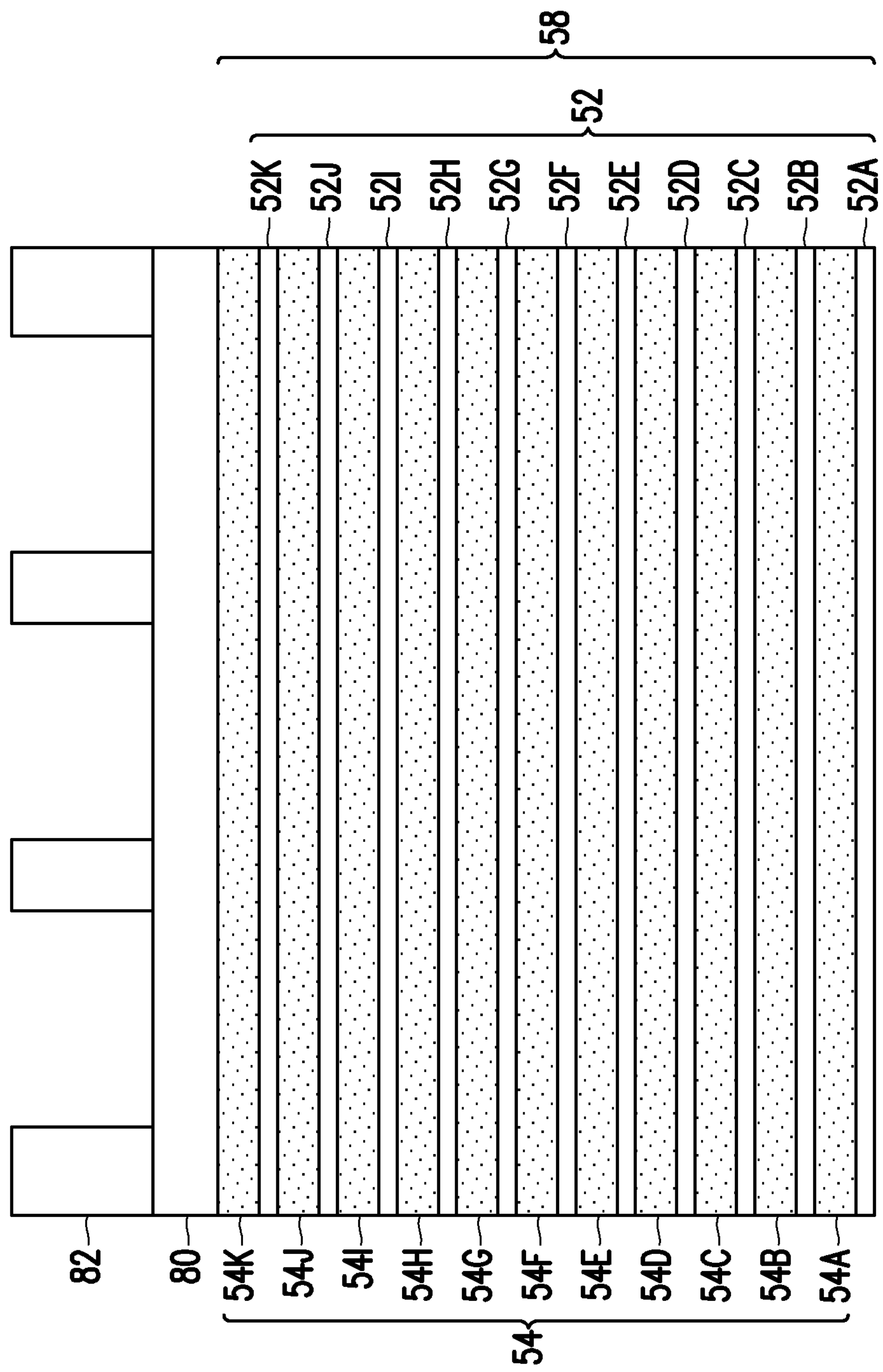

In FIG. 4 a hard mask 80 is deposited over the multi-layer stack 58 and a first patterned mask 82, such as a patterned photoresist, is formed over the hard mask 80. The hard mask 80 may include, for example, silicon nitride, silicon oxynitride, or the like, which may be deposited by CVD, PVD, ALD, PECVD, or the like. The first patterned mask 82 may be formed by depositing a photosensitive layer over the hard mask 80 using spin-on coating or the like. The photosensitive layer may then be patterned by exposing the photosensitive layer to a patterned energy source (e.g., a patterned light source) and developing the photosensitive layer to remove an exposed or unexposed portion of the second photosensitive layer, thereby forming the first patterned mask 82.

Figure 5:
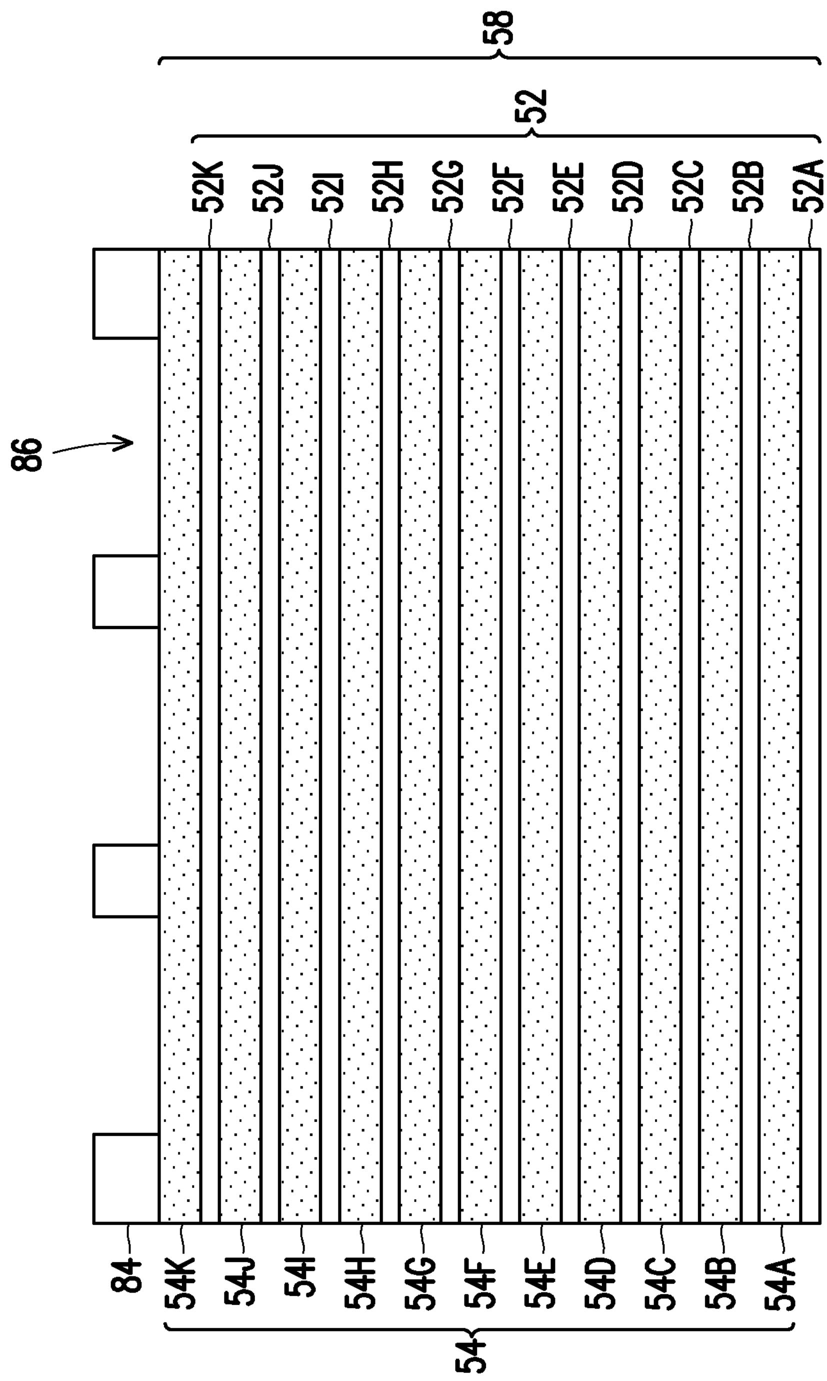

In FIG. 5, first openings 86 are formed in the hard mask 80. A pattern of the first patterned mask 82 may be transferred to the hard mask 80 using a suitable etching process, such as wet or dry etching, a reactive ion etch (RIE), a neutral beam etch (NBE), the like, or a combination thereof. The suitable etching process may be anisotropic. The first patterned mask 82 may be removed by a suitable process, such as an ashing process, a stripping process, the like, or a combination thereof, after forming the first openings 86 in the hard mask 80.

Figure 6:
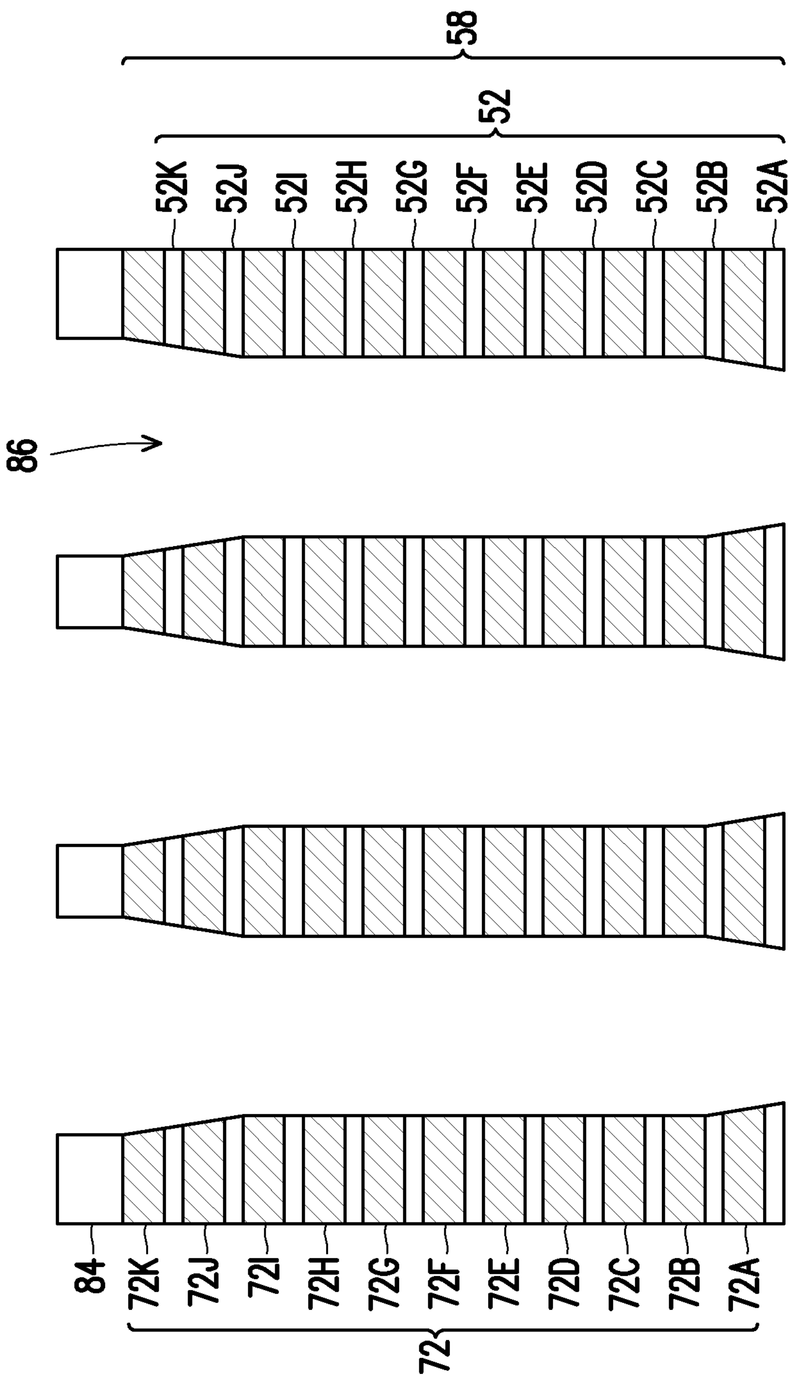

In FIG. 6, the first openings 86 are extended through the multi-layer stack 58. A pattern of the hard mask 80 may be transferred to the multi-layer stack 58 using one or more suitable etching processes, such as wet or dry etching, RIE, NBE, the like, or a combination thereof. The suitable etching processes may be anisotropic. The first openings 86 separate the conductive layers 54A-54K into conductive lines 72A-72K (e.g., word lines, collectively referred to as conductive lines 72). For example, by etching the first openings 86 through the conductive layers 54, adjacent conductive lines 72 can be separated from each other.

As illustrated in FIG. 6, the etching processes used to form the first openings 86 may cause portions of the first openings 86 to be formed with tapered sidewalls. For example, portions of the first openings 86 adjacent the conductive lines 72A, 72J, and 72K and the dielectric layers 52A, 52B, 52J, and 52K may have tapered sidewalls, while portions of the first openings 86 adjacent the conductive lines 72B-72I and the dielectric layers 52C-52I may have substantially vertical sidewalls. Forming channel regions in the portions of the first openings 86 having the tapered sidewalls may cause characteristics of the channel regions (e.g., threshold voltages and the like) to vary and be less reliable, which may result in device defects in subsequently formed transistors and memory cells. As such, dummy transistors (e.g., non-functional devices) may be subsequently formed in the portions of the first openings 86 having the tapered sidewalls to reduce the device defects in the resulting device, while functional transistors are formed in the portions of the first openings 86 having the vertical sidewalls.

FIGS. 7 through 10B illustrate forming and patterning channel regions for the transistors 204 (see FIG. 1A) in the first openings 86. FIGS. 7 through 9 and 10B illustrate reference cross-section B-B' illustrated in FIG. 1A. FIG. 10A illustrates a top-down view.

Figure 7:
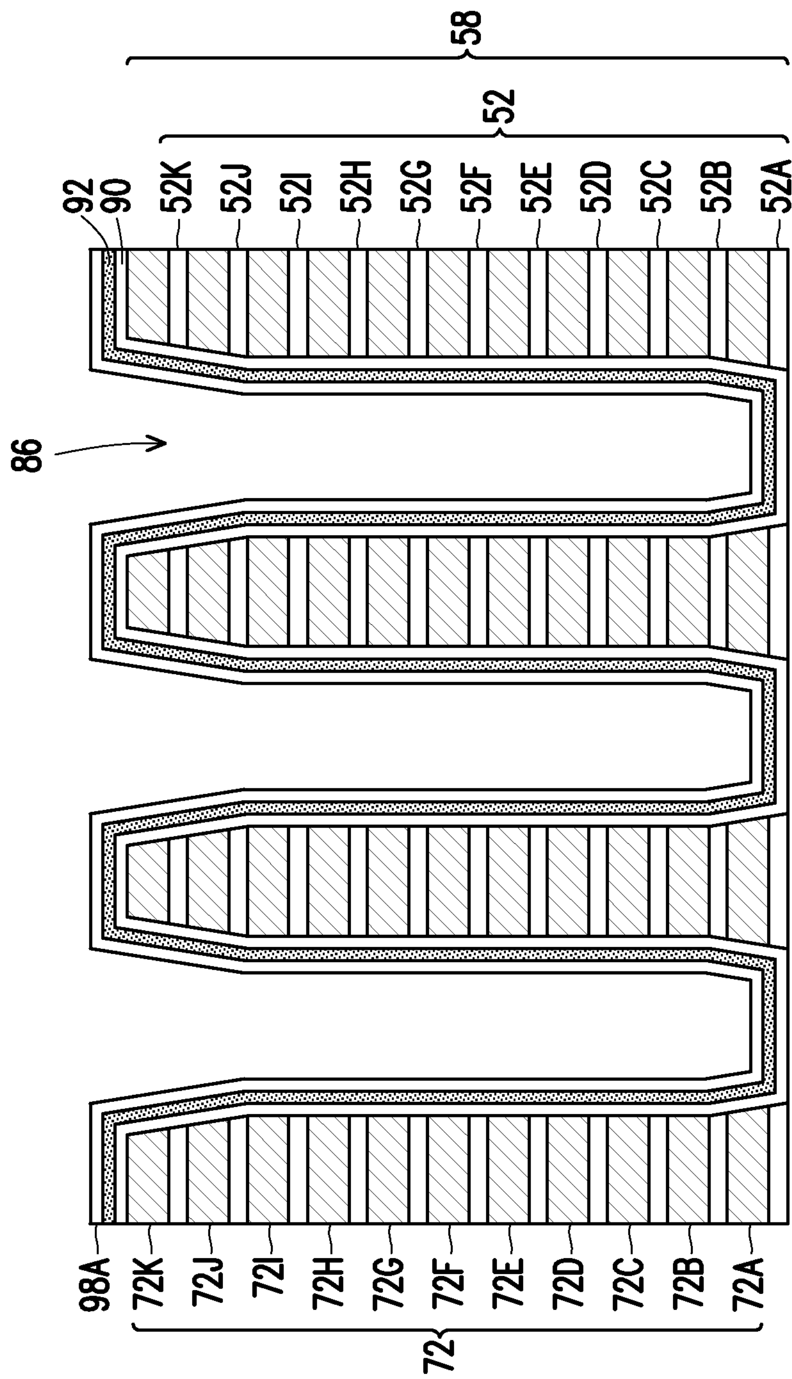

In FIG. 7, the hard mask 80 is removed and FE materials 90, an OS layer 92, and a first dielectric layer 98A are deposited in the first openings 86. The hard mask 80 may be removed by a suitable process, such as a wet etching process, a dry etching process, a planarization process, combinations thereof, or the like.

The FE materials 90 may be deposited conformally in the first openings 86 along sidewalls of the conductive lines 72 and the dielectric layers 52 and along top surfaces of the conductive lines 72K and the substrate 50. The FE materials 90 may comprise a material that is capable of switching between two different polarization directions by applying an appropriate voltage differential across the FE materials 90. For example, the FE materials 90 may be high-k dielectric materials, such as a hafnium (Hf) based dielectric materials or the like. In some embodiments, the FE materials 90 comprise hafnium oxide, hafnium zirconium oxide, silicon-doped hafnium oxide, or the like. In some embodiments, the FE materials 90 may be multilayer structures comprising a layer of $SiN_x$ between two $SiO_x$ layers (e.g., ONO structures). In some embodiments, the FE materials 90 may comprise different ferroelectric materials or different types of memory materials. The FE materials 90 may be deposited by CVD, PVD, ALD, PECVD, or the like.

The OS layer 92 is conformally deposited in the first openings 86 over the FE materials 90. The OS layer 92 comprises materials suitable for providing channel regions for the transistors 204 (see FIG. 1A). For example, the OS layer 92 may include zinc oxide (ZnO), indium tungsten oxide (InWO), indium gallium zinc oxide (InGaZnO), indium zinc oxide (InZnO), indium tin oxide (ITO), combinations thereof, or the like. The OS layer 92 may be deposited by CVD, PVD, ALD, PECVD, or the like. The OS layer 92 may extend along sidewalls and bottom surfaces of the first openings 86 over the FE materials 90.

The first dielectric layer 98A is deposited in the first openings 86 over the OS layer 92. The first dielectric layer 98A may include, for example, silicon oxide, silicon nitride, silicon oxynitride, or the like, which may be deposited by CVD, PVD, ALD, PECVD, or the like. The first dielectric layer 98A may extend along sidewalls and bottom surfaces of the first openings 86 over the OS layer 92.

Figure 8:
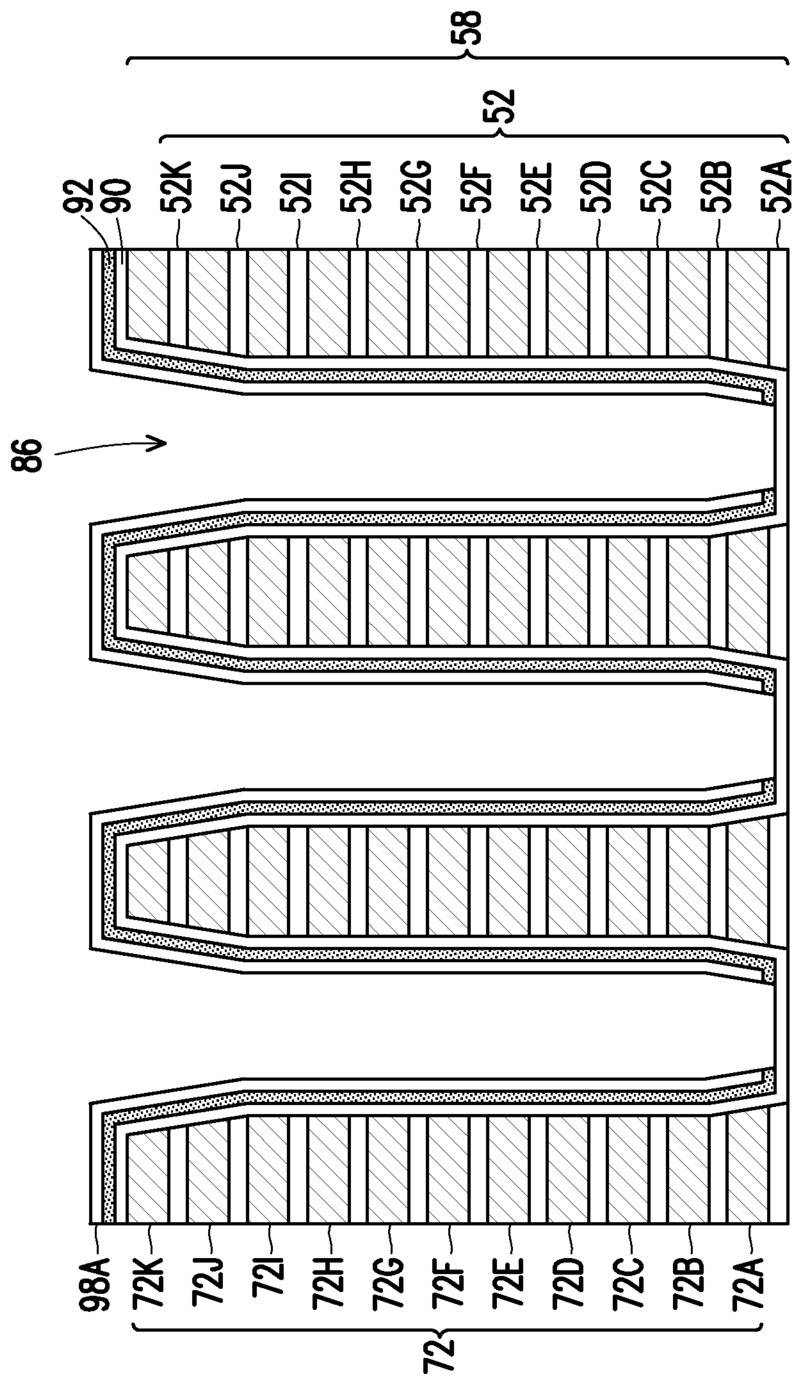

In FIG. 8, bottom portions of the first dielectric layer 98A and the OS layer 92 in the first openings 86 are removed. In some embodiments, the bottom portions of the first dielectric layer 98A may be removed using suitable photolithography and etching processes. The etching may be any suitable etching processes, such as wet or dry etching, RIE, NBE, the like, or a combination thereof. The suitable etching processes may be anisotropic.

The first dielectric layer 98A may then be used as a mask to etch the bottom portions of the OS layer 92 in the first openings 86. The bottom portions of the OS layer 92 may be etched by any suitable etching processes, such as wet or dry etching, RIE, NBE, the like, or a combination thereof. The suitable etching processes may be anisotropic. Etching the OS layer 92 may expose portions of the FE materials 90 on bottom surfaces of the first openings 86. Thus, portions of the OS layer 92 on opposing sidewalls of the first openings 86 may be separated from each other, which improves isolation between the memory cells 202 of the memory array 200 (see FIG. 1A).

Figure 9:
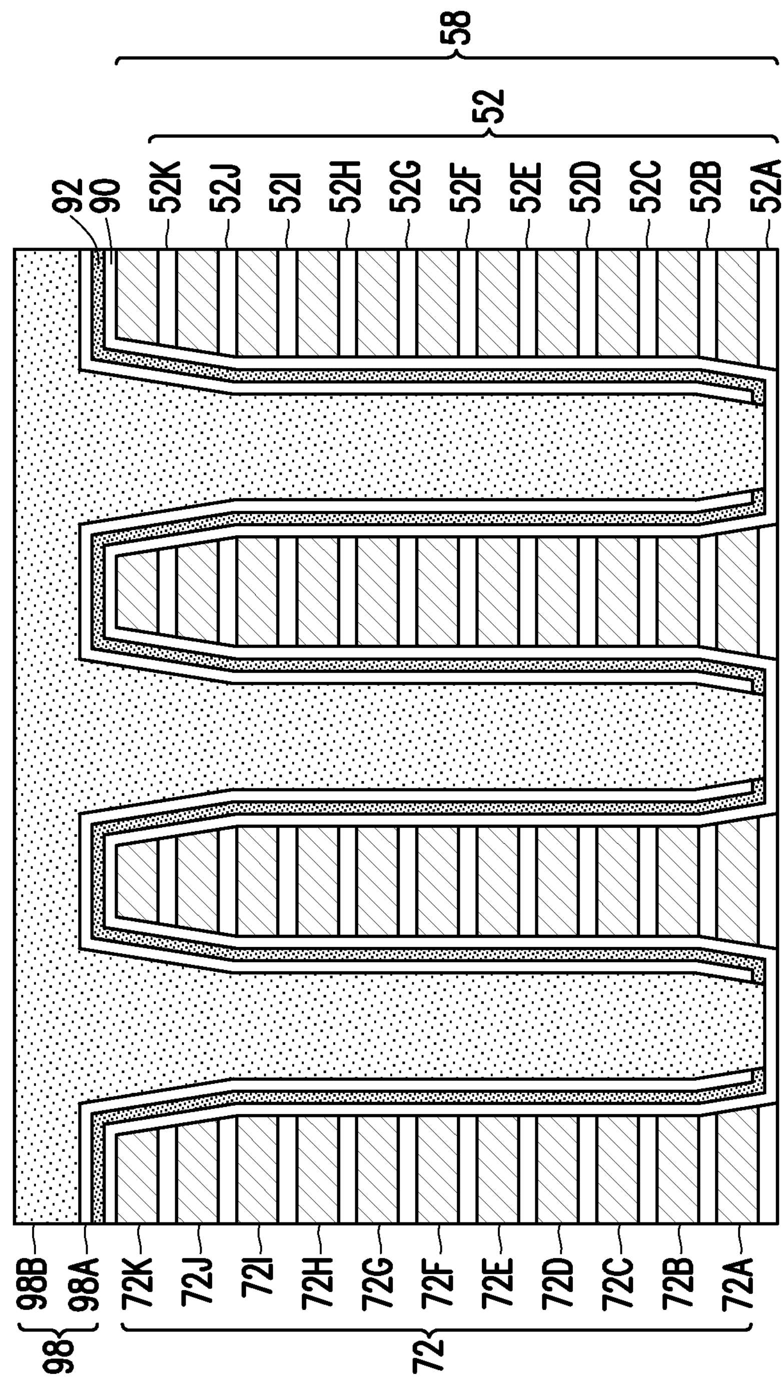

In FIG. 9, additional dielectric materials 98B are deposited over the first dielectric layer 98A and filling remaining portions of the first openings 86. The additional dielectric materials 98B may be formed of materials and by processes the same as or similar to those of the first dielectric layer 98A. The additional dielectric materials 98B and the first dielectric layer 98A may be referred to collectively as first dielectric materials 98.

Figure 10A:
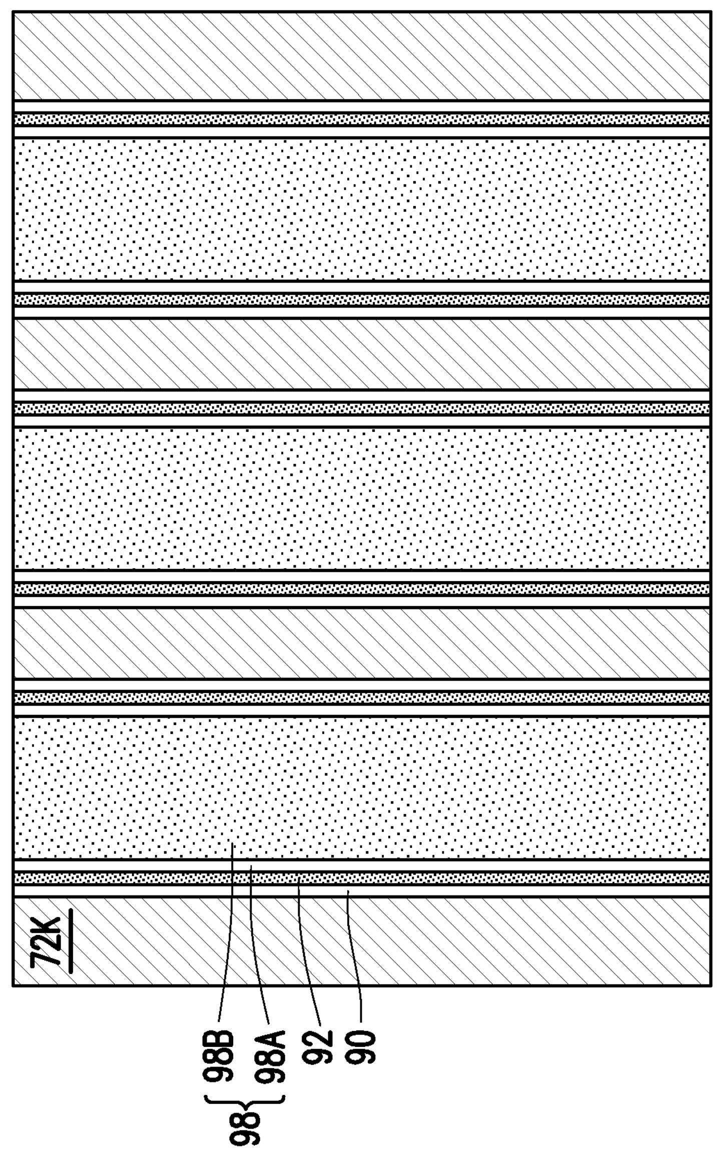
Figure 10B:
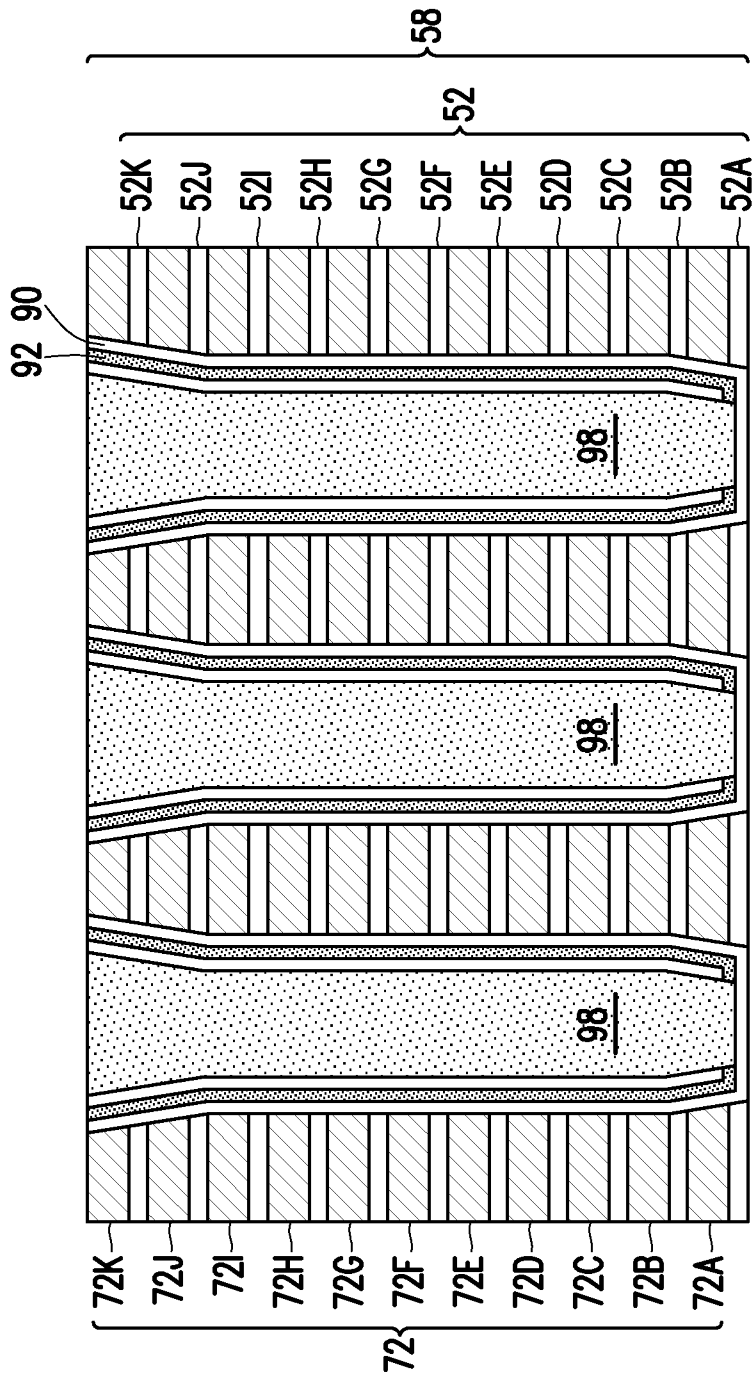

In FIGS. 10A and 10B, top surfaces of the first dielectric materials 98, the OS layer 92, the FE materials 90, and the conductive lines 72K are planarized by a suitable planarization process. The suitable planarization process may be a chemical mechanical polish (CMP), an etch-back process, combinations thereof, or the like. As illustrated in FIG. 10B, the suitable planarization process exposes the multi-layer stack 58 such that top surfaces of the multi-layer stack 58 (e.g., top surfaces of the conductive lines 72K), the first dielectric materials 98, the OS layer 92, and the FE materials 90 are level after the suitable planarization process is complete.

Figure 12A:
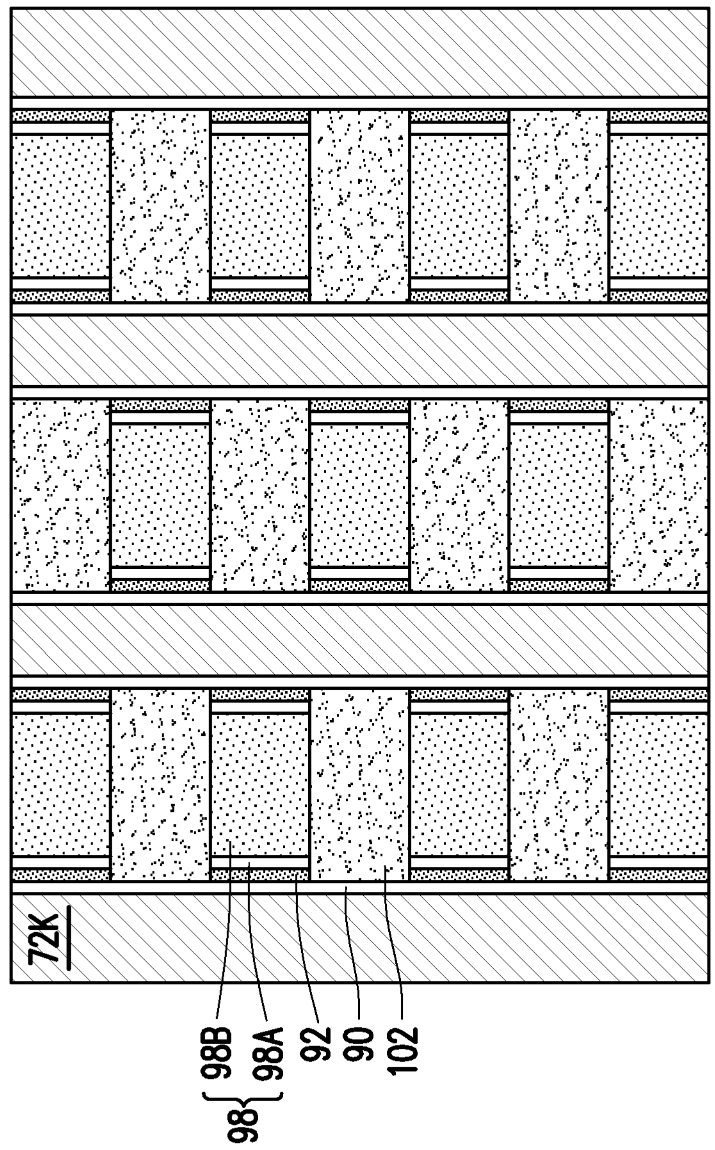
Figure 12B:
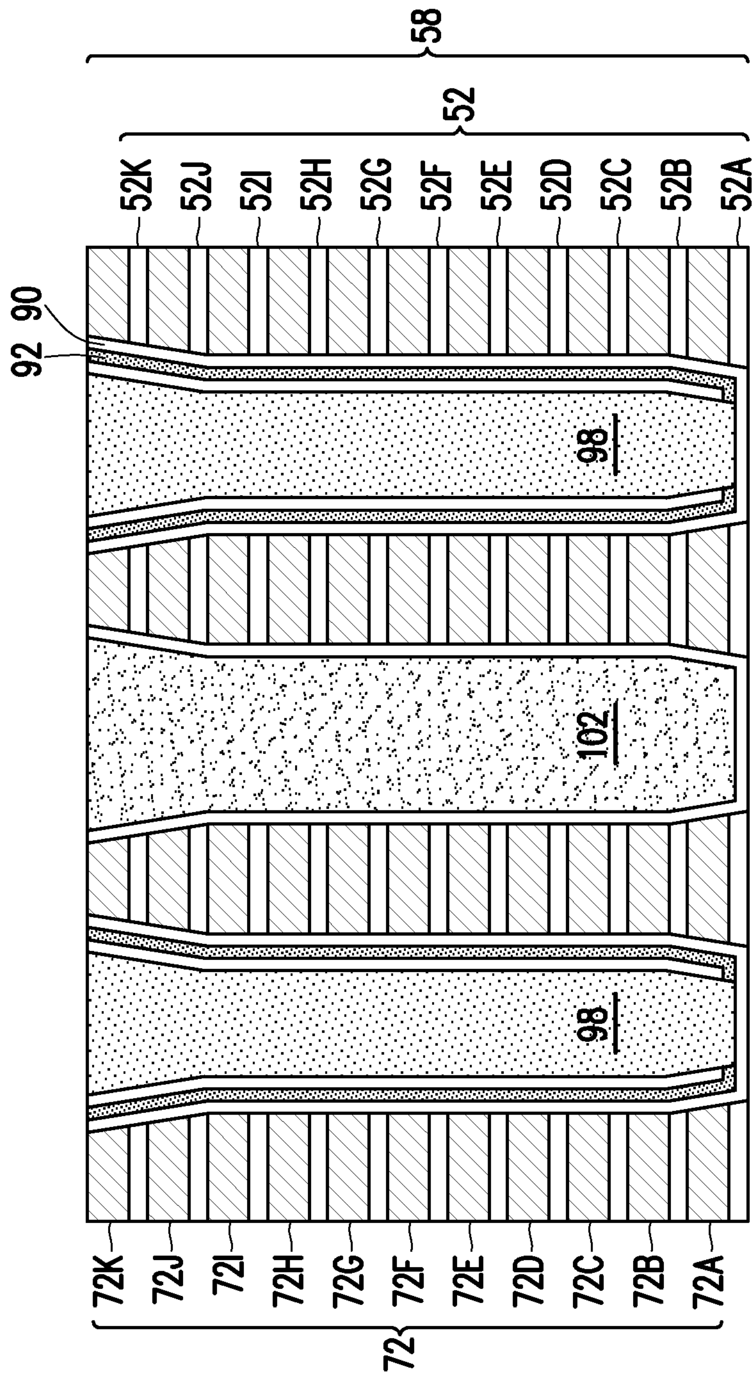
Figure 13A:
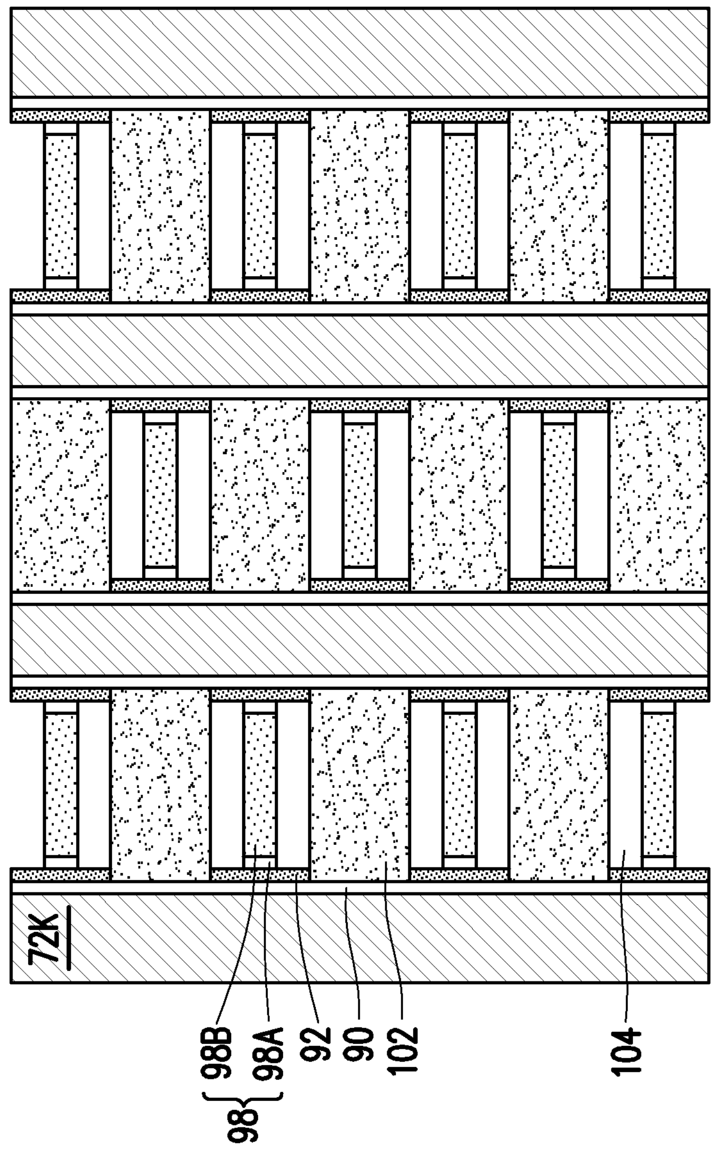
Figure 13B:
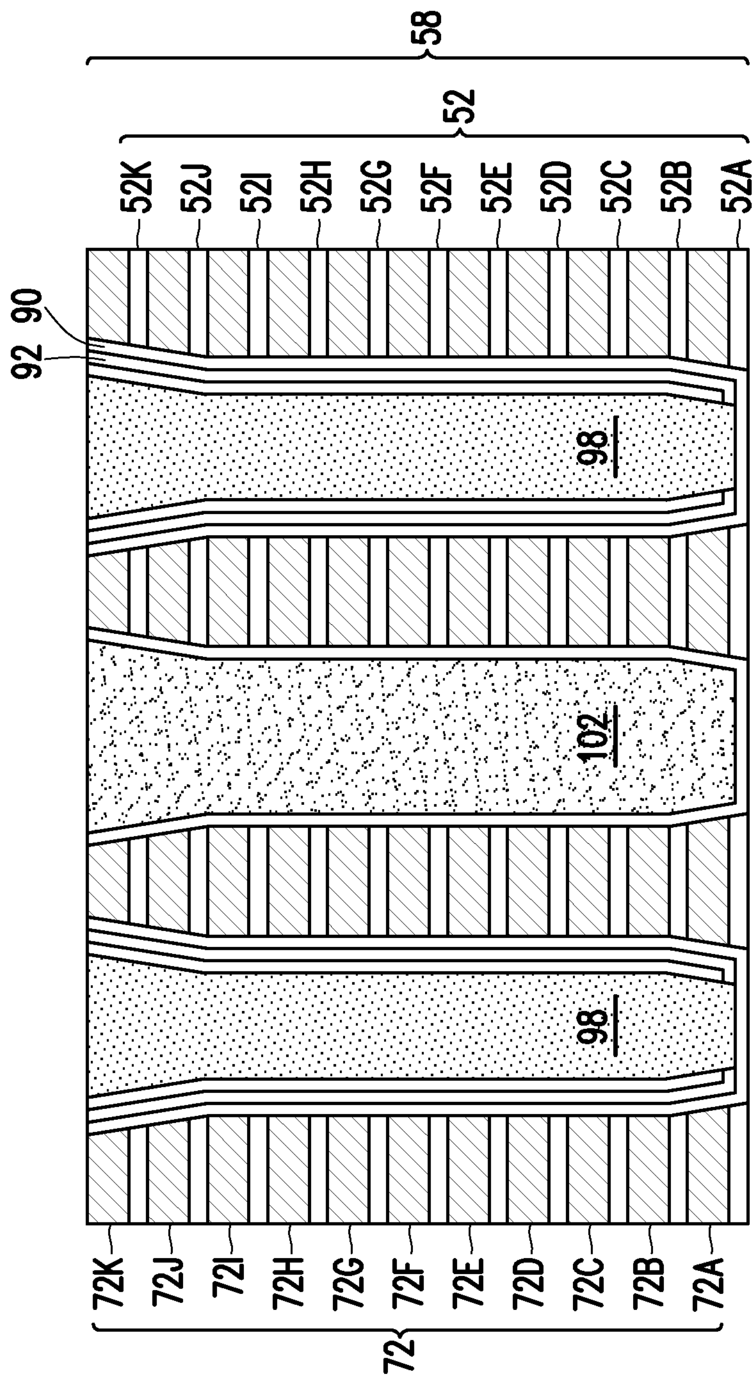
Figure 13C:
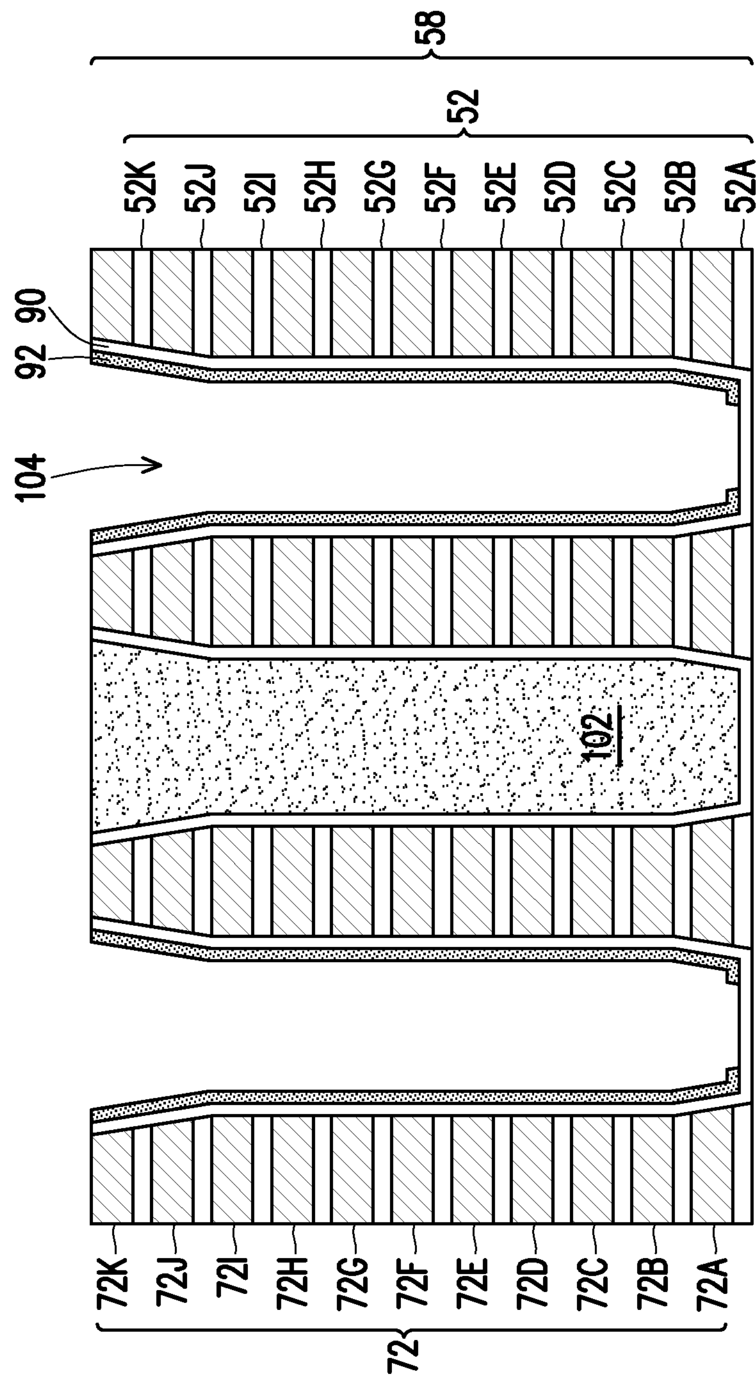
Figure 14A:
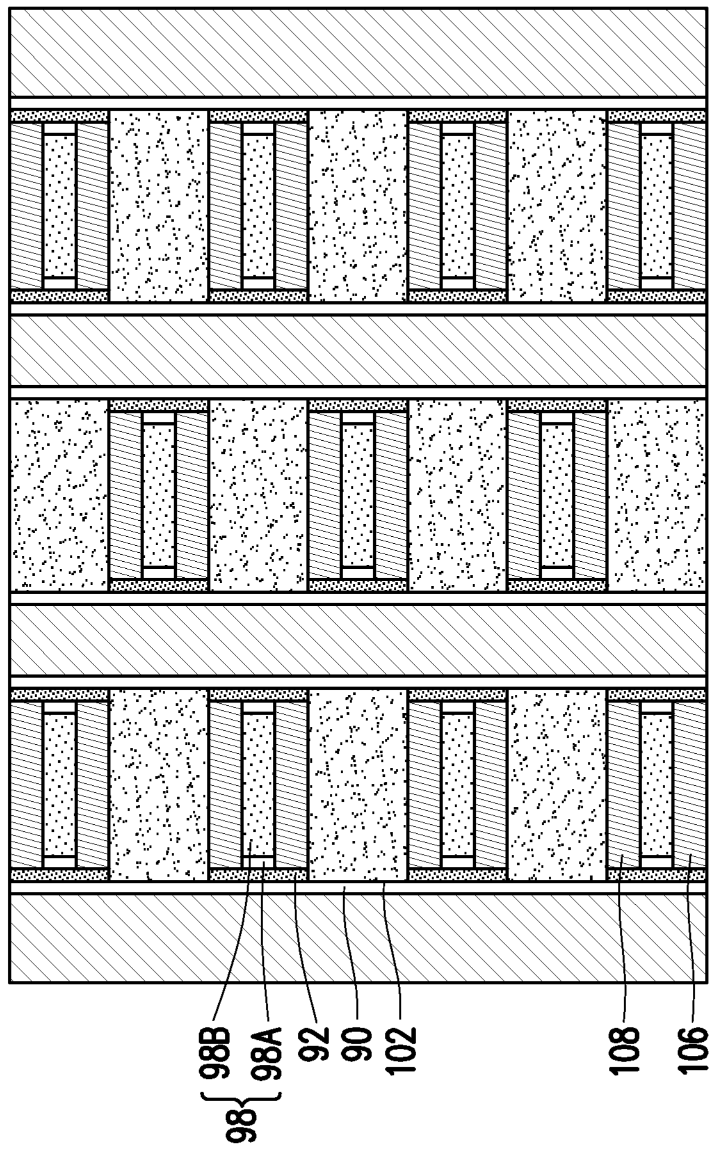
Figure 14B:
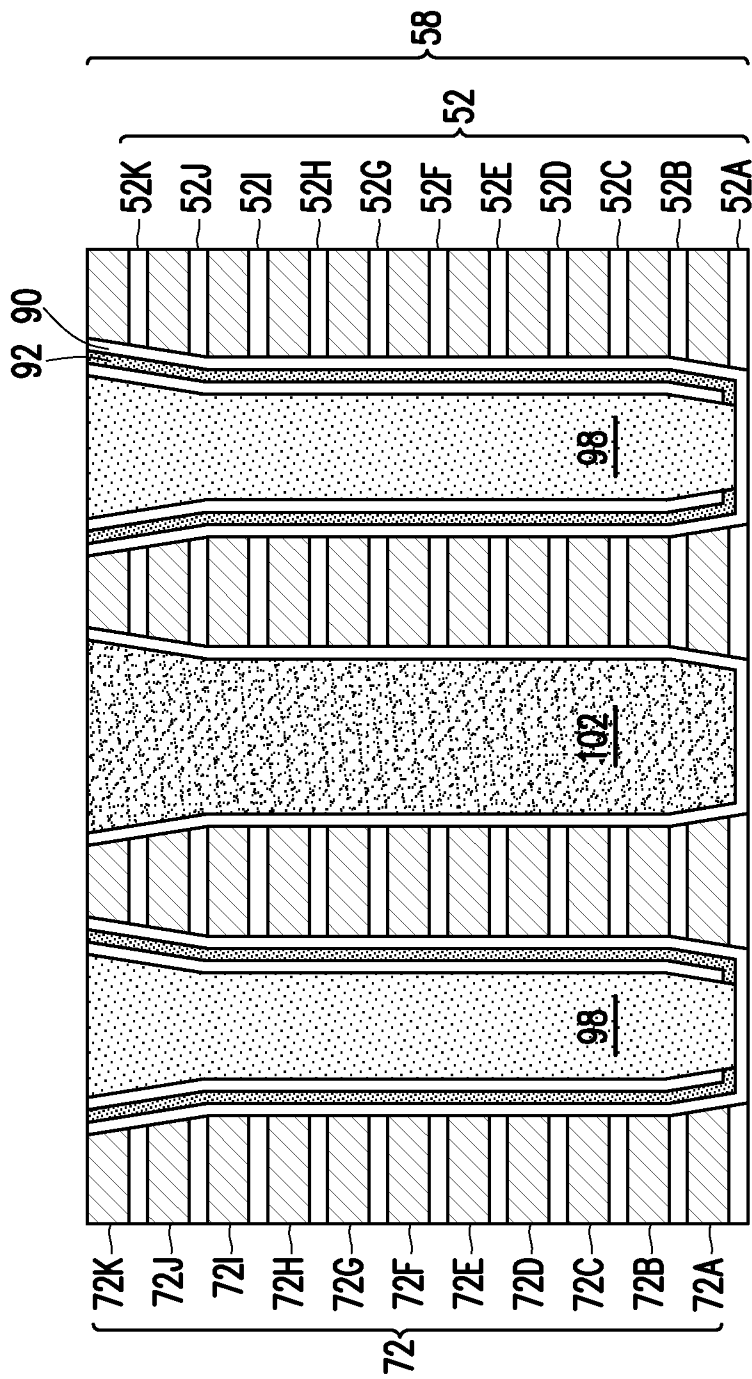
Figure 14C:
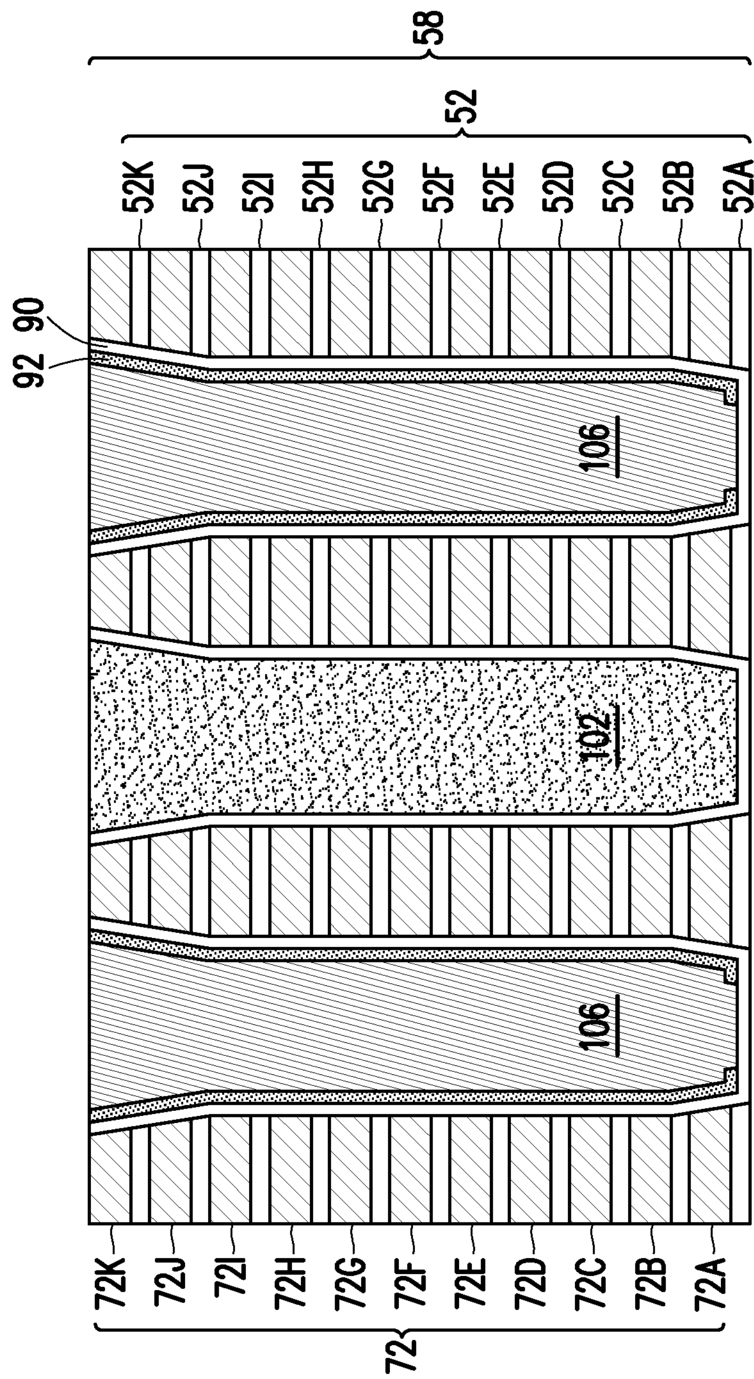

FIGS. 11A through 14C illustrate intermediate steps of manufacturing conductive lines 106 and conductive lines 108 (e.g., source lines and bit lines) in the memory array 200. The conductive lines 106 and the conductive lines 108 may extend in a direction perpendicular to the conductive lines 72, such that individual cells of the memory array 200 may be selected for read and write operations. FIGS. 11A, 12A, 13A, and 14A illustrate a top-down view. FIGS. 11B, 12B, 13B, and 14B illustrate reference cross-section B-B' illustrated in FIG. 1A. FIGS. 13C and 14C illustrate reference cross-section C-C' illustrated in FIG. 1A.

Figure 11A:
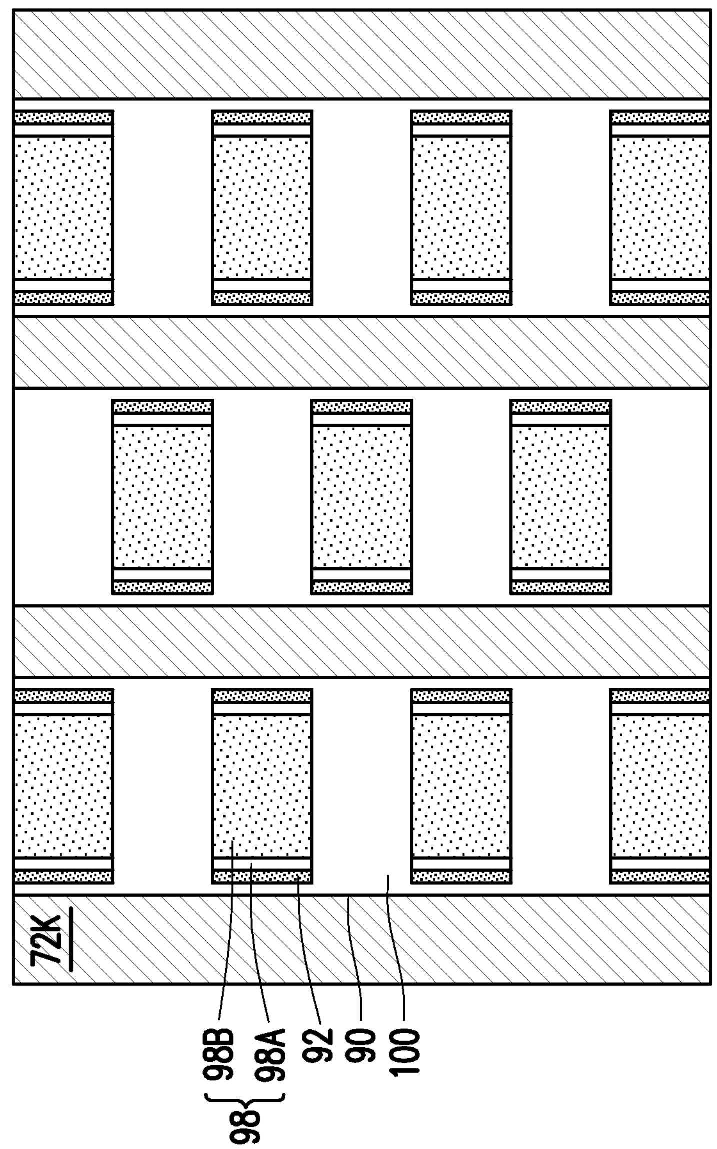
Figure 11B:
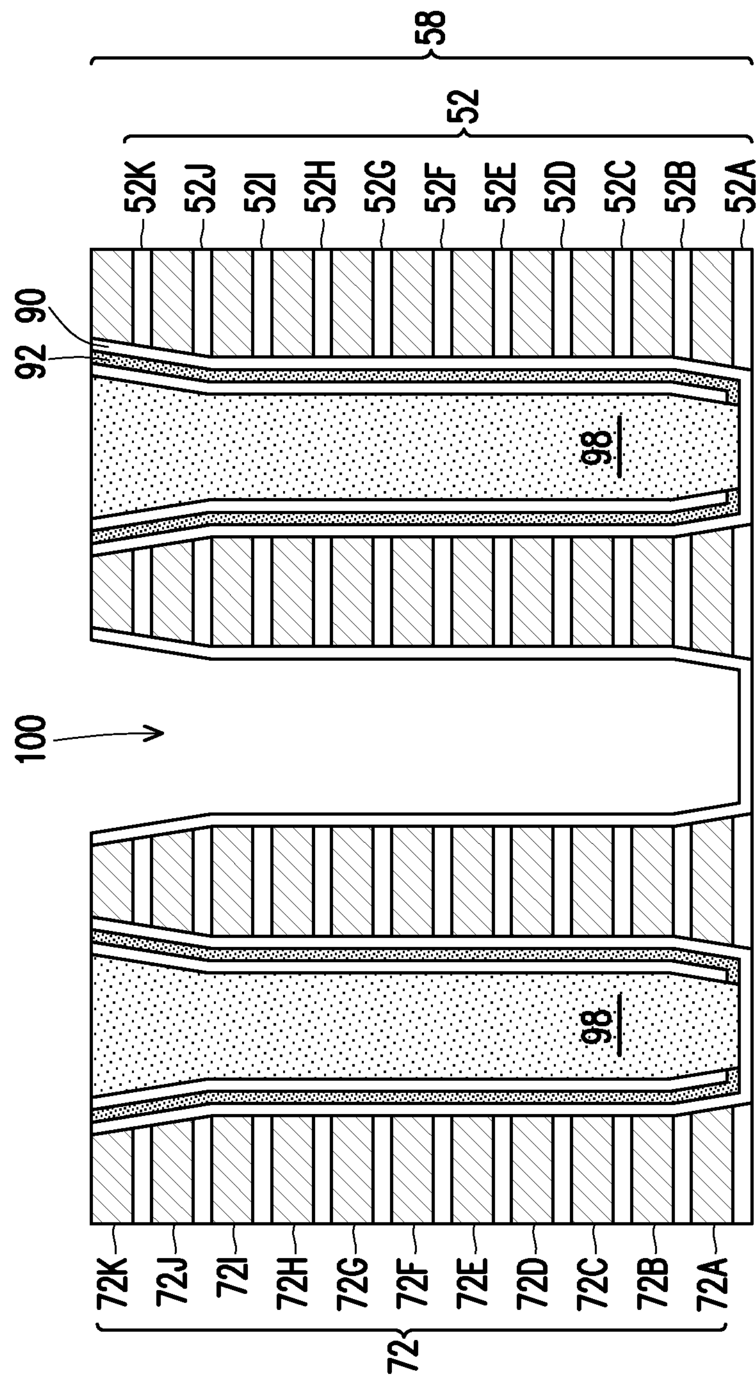

In FIGS. 11A and 11B, second openings 100 are patterned through the first dielectric materials 98 and the OS layer 92. The second openings 100 may be patterned in the first dielectric materials 98 and the OS layer 92 using suitable photolithography and etching processes. The etching processes may be any acceptable etching processes, such as by wet or dry etching, RIE, NBE, the like, or a combination thereof. The etching processes may be anisotropic. The second openings 100 may be disposed between opposing sidewalls of the FE materials 90 and may expose sidewalls and bottom surfaces of the FE materials 90. The second openings 100 may physically separate adjacent stacks of memory cells 202 in the memory array 200 (see FIG. 1A).

In FIGS. 12A and 12B, second dielectric materials 102 are deposited in and fill the second openings 100. The second dielectric materials 102 may include, for example, silicon oxide, silicon nitride, silicon oxynitride, or the like, which may be deposited by CVD, PVD, ALD, PECVD, or the like. The second dielectric materials 102 may extend along sidewalls and bottom surfaces of the second openings 100 over the FE materials 90. After the second dielectric materials 102 are deposited, a suitable planarization process (e.g., a CMP, an etch-back, or the like) may be performed to remove excess portions of the second dielectric materials 102. As illustrated in FIG. 12B, following the planarization process, top surfaces of the multi-layer stack 58, the FE materials 90, the OS layer 92, the first dielectric materials 98, and the second dielectric materials 102 may be substantially level (e.g., within process variations).

In some embodiments, materials of the first dielectric materials 98 and the second dielectric materials 102 may be selected such that the first dielectric materials 98 and the second dielectric materials 102 may be etched selectively relative each other. For example, in some embodiments, the first dielectric materials 98 are an oxide and the second dielectric materials 102 are a nitride. In some embodiments, the first dielectric materials 98 are a nitride and the second dielectric materials 102 are an oxide. Other materials are also possible.

In FIGS. 13A through 13C, third openings 104 are patterned through the first dielectric materials 98. The third openings 104 may be patterned through the first dielectric materials 98 using suitable photolithography and etching processes. The etching processes may be any acceptable etching processes, such as by wet or dry etching, RIE, NBE, the like, or a combination thereof. The etching processes may be anisotropic. The etching processes may use etchants that etch the first dielectric materials 98 without significantly etching the second dielectric materials 102, the OS layer 92, and the FE materials 90. A pattern of the third openings 104 may correspond to the subsequently formed conductive lines (such as the conductive lines 106 and the conductive lines 108, discussed below with respect to FIGS. 14A through 14C). In some embodiments, portions of the first dielectric materials 98 may remain between each pair of the third openings 104, and the second dielectric materials 102 may be disposed between adjacent pairs of the third openings 104.

In FIGS. 14A through 14C, the third openings 104 are filled with conductive materials to form the conductive lines 106 and the conductive lines 108. The conductive lines 106 and the conductive lines 108 may comprise conductive materials, such as, copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive materials are deposited, a suitable planarization process (e.g., a CMP, an etch-back, or the like) may be performed to remove excess portions of the conductive materials, thereby forming the conductive lines 106 and the conductive lines 108. As illustrated in FIGS. 14B and 14C, following the planarization process, top surfaces of the multi-layer stack 58, the FE materials 90, the OS layer 92, the first dielectric materials 98, the second dielectric materials 102, the conductive lines 106, and the conductive lines 108 may be substantially level (e.g., within process variations).

The conductive lines 106 may correspond to bit lines in the memory array 200, and the conductive lines 108 may correspond to source lines in the memory array 200. Further the conductive lines 106 and the conductive lines 108 may provide source/drain electrodes for the transistors 204 in the memory array 200. Although FIG. 14C illustrates a cross-sectional view that only shows the conductive lines 106, a cross-sectional view of the conductive lines 108 may be similar.

FIGS. 15 through 22 are views of intermediate stages in the manufacturing a staircase structure of the memory array 200, in accordance with some embodiments. FIGS. 15 through 22 illustrate reference cross-section A-A' illustrated in FIG. 1A. Although the staircase structure is discussed as being formed after forming the channel regions for the transistors 204, the conductive lines 106, and the conductive lines 108, in some embodiments, the staircase structure may be formed before forming the channel regions for the transistors 204, the conductive lines 106, and the conductive lines 108. For example, the staircase structure may be patterned prior to the manufacturing steps described in FIGS. 4 through 14C. The same or similar processes may be used in staircase-first and staircase-last embodiments.

Figure 15:
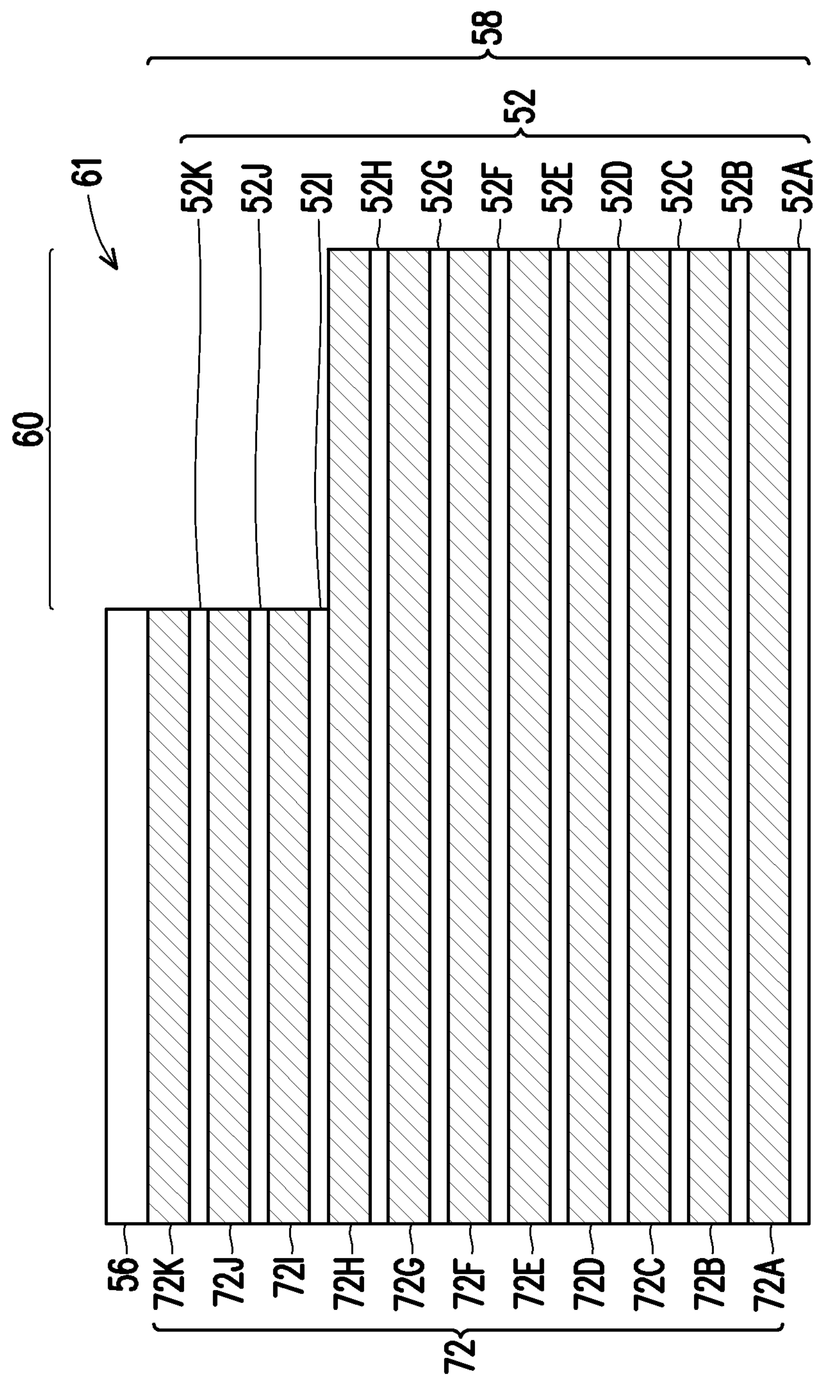

In FIG. 15, a second patterned mask 56, such as a patterned photoresist, is formed over the multi-layer stack 58 and portions of the multi-layer stack 58 exposed by the second patterned mask 56 are etched. The second patterned mask 56 may be formed by depositing a photosensitive layer over the multi-layer stack 58 using spin-on coating or the like. The photosensitive layer may then be patterned by exposing the photosensitive layer to a patterned energy source (e.g., a patterned light source) and developing the photosensitive layer to remove an exposed or unexposed portion of the second photosensitive layer, thereby forming the second patterned mask 56. The second patterned mask 56 may be patterned to cover portions of the multi-layer stack 58 in which the FE materials 90, the OS layer 92, the first dielectric materials 98, the second dielectric materials 102, the conductive lines 106, and the conductive lines 108 are formed such that the portions are protected during the manufacturing of the staircase structure.

Exposed portions of the multi-layer stack 58 may then be etched using the second patterned mask 56 as a mask. The etching may be any suitable etching process, such as wet or dry etching, RIE, NBE, the like, or a combination thereof. The etching process may be anisotropic. The etching process may remove portions of the conductive lines 72K, 72J, and 72I and the dielectric layers 52K, 52J, and 52I in a region 60 to define fourth openings 61. Because the conductive lines 72 and the dielectric layers 52 have different material compositions, etchants used to remove exposed portions of these layers may be different. In some embodiments, the dielectric layers 52 act as etch stop layers while etching the conductive lines 72, and the conductive lines 72 acts as etch stop layers while etching dielectric layers 52. As a result, the portions of the conductive lines 72 and the dielectric layers 52 may be selectively removed without removing remaining layers of the multi-layer stack 58, and the fourth openings 61 may be extended to a desired depth. Alternatively, timed etch processes may be used to stop the etching of the fourth openings 61 after the fourth openings 61 reach a desired depth. In the resulting structure, the conductive lines 72H are exposed in the region 60.

Figure 16:
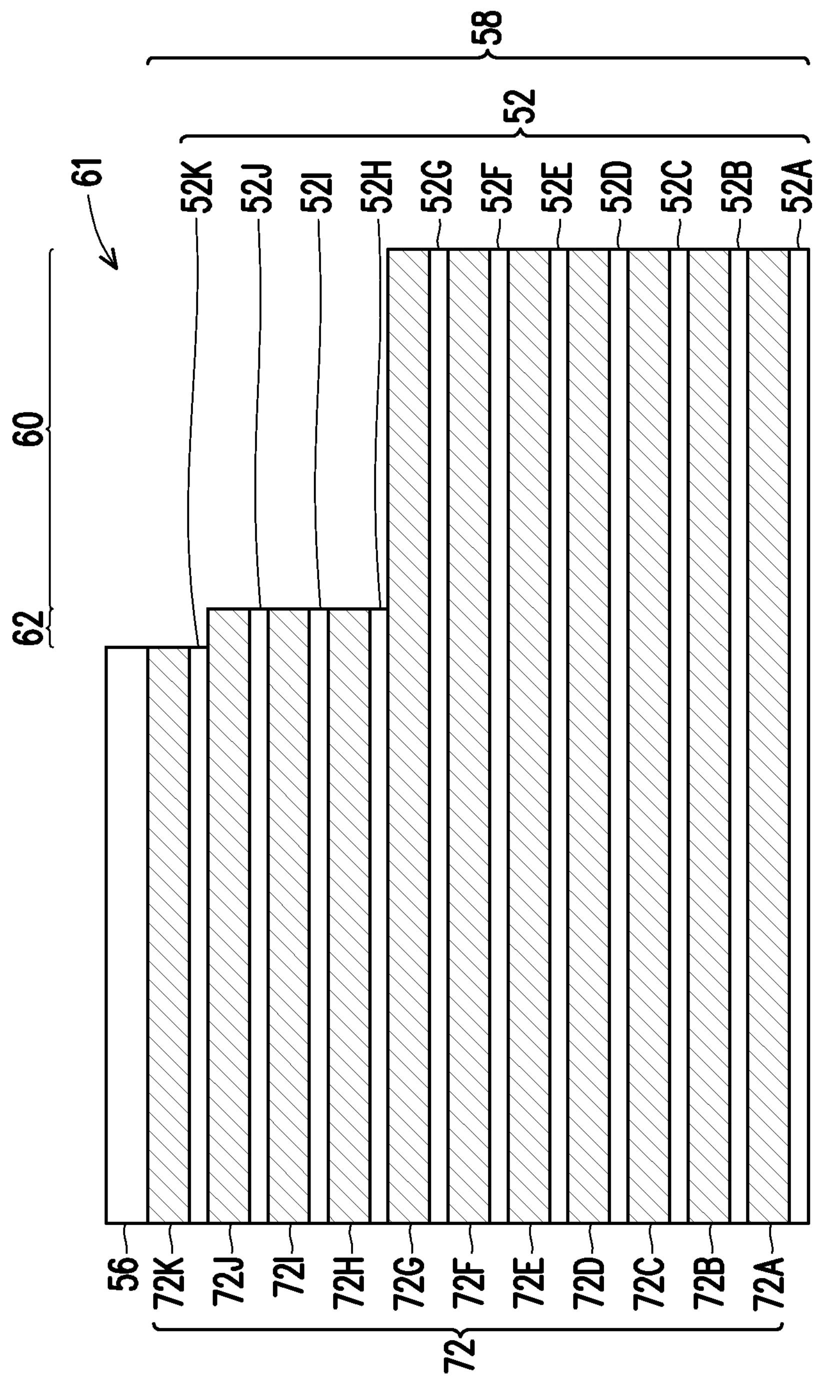

In FIG. 16, the second patterned mask 56 is trimmed to expose additional portions of the multi-layer stack 58. The second patterned mask 56 can be trimmed using acceptable photolithography techniques. As a result of the trimming, a width of the second patterned mask 56 is reduced, and portions the multi-layer stack 58 in the region 60 and a region 62 are exposed. For example, top surfaces of the conductive lines 72K in the region 62 and top surfaces of the conductive lines 72H in the region 60 may be exposed.

Exposed portions of the multi-layer stack 58 may then be etched using the second patterned mask 56 as a mask. The etching may be any suitable etching process, such as wet or dry etching, RIE, NBE, the like, or a combination thereof. The etching process may be anisotropic. The etching may extend the fourth openings 61 further into the multi-layer stack 58. Because the conductive lines 72 and the dielectric layers 52 have different material compositions, etchants used to remove exposed portions of these layers may be different. In some embodiments, the dielectric layers 52 act as etch stop layers while etching the conductive lines 72, and the conductive lines 72 acts as etch stop layers while etching dielectric layers 52. As a result, the portions of the conductive lines 72 and the dielectric layers 52 may be selectively removed without removing remaining layers of the multi-layer stack 58, and the fourth openings 61 may be extended to a desired depth. Alternatively, timed etch processes may be used to stop the etching of the fourth openings 61 after the fourth openings 61 reach a desired depth. Further, during the etching process, unetched portions of the conductive lines 72 and the dielectric layers 52 act as masks for underlying layers, and as a result a previous pattern of the conductive lines 72K, 72J, and 72I and the dielectric layers 52K, 52J, and 52I (see FIG. 15) may be transferred to the underlying conductive lines 72H and the underlying dielectric layer 52H. In the resulting structure, the conductive lines 72J are exposed in the region 62 and the conductive lines 72G are exposed in the region 60.

Figure 17:
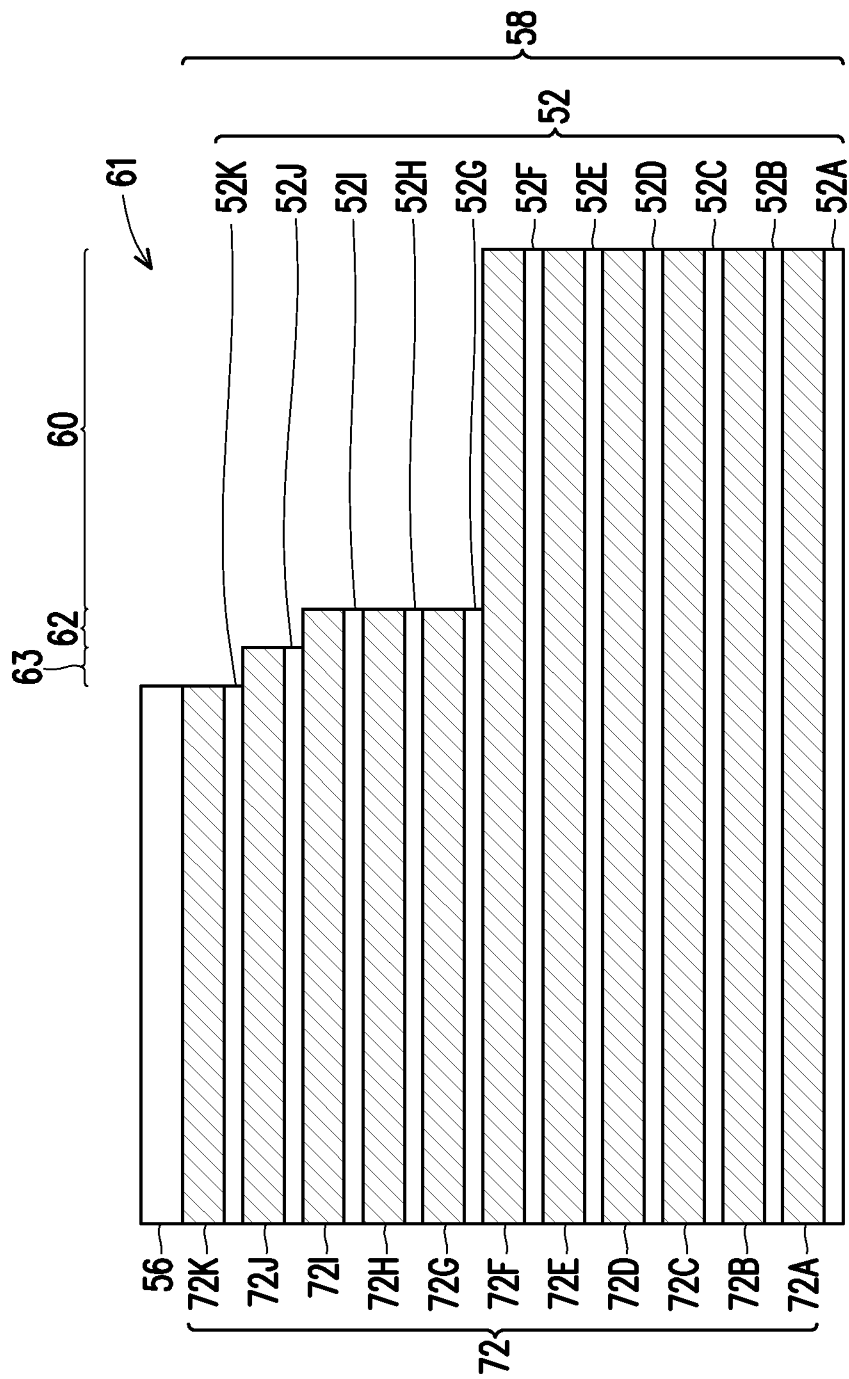

In FIG. 17, the second patterned mask 56 is trimmed to expose additional portions of the multi-layer stack 58. The second patterned mask 56 can be trimmed using acceptable photolithography techniques. As a result of the trimming, a width of the second patterned mask 56 is reduced, and portions the multi-layer stack 58 in the region 60, the region 62 and a region 63 are exposed. For example, top surfaces of the conductive lines 72K in the region 63, top surfaces of the conductive lines 72J in the region 62, and top surfaces of the conductive lines 72G in the region 60 may be exposed.

Exposed portions of the multi-layer stack 58 may then be etched using the second patterned mask 56 as a mask. The etching may be any suitable etching process, such as wet or dry etching, RIE, NBE, the like, or a combination thereof. The etching process may be anisotropic. The etching may extend the fourth openings 61 further into the multi-layer stack 58. Because the conductive lines 72 and the dielectric layers 52 have different material compositions, etchants used to remove exposed portions of these layers may be different. In some embodiments, the dielectric layers 52 act as etch stop layers while etching the conductive lines 72, and the conductive lines 72 acts as etch stop layers while etching dielectric layers 52. As a result, the portions of the conductive lines 72 and the dielectric layers 52 may be selectively removed without removing remaining layers of the multi-layer stack 58, and the fourth openings 61 may be extended to a desired depth. Alternatively, timed etch processes may be used to stop the etching of the fourth openings 61 after the fourth openings 61 reach a desired depth. Further, during the etching process, unetched portions of the conductive lines 72 and the dielectric layers 52 act as masks for underlying layers, and as a result a previous pattern of the conductive lines 72K-72H and the dielectric layers 52K-52H (see FIG. 16) may be transferred to the underlying conductive lines 72J and 72G and the underlying dielectric layers 52J and 52G. In the resulting structure, the conductive lines 72J are exposed in the region 63, the conductive lines 72I are exposed in the region 62, and the conductive lines 72F are exposed in the region 60.

Figure 18:
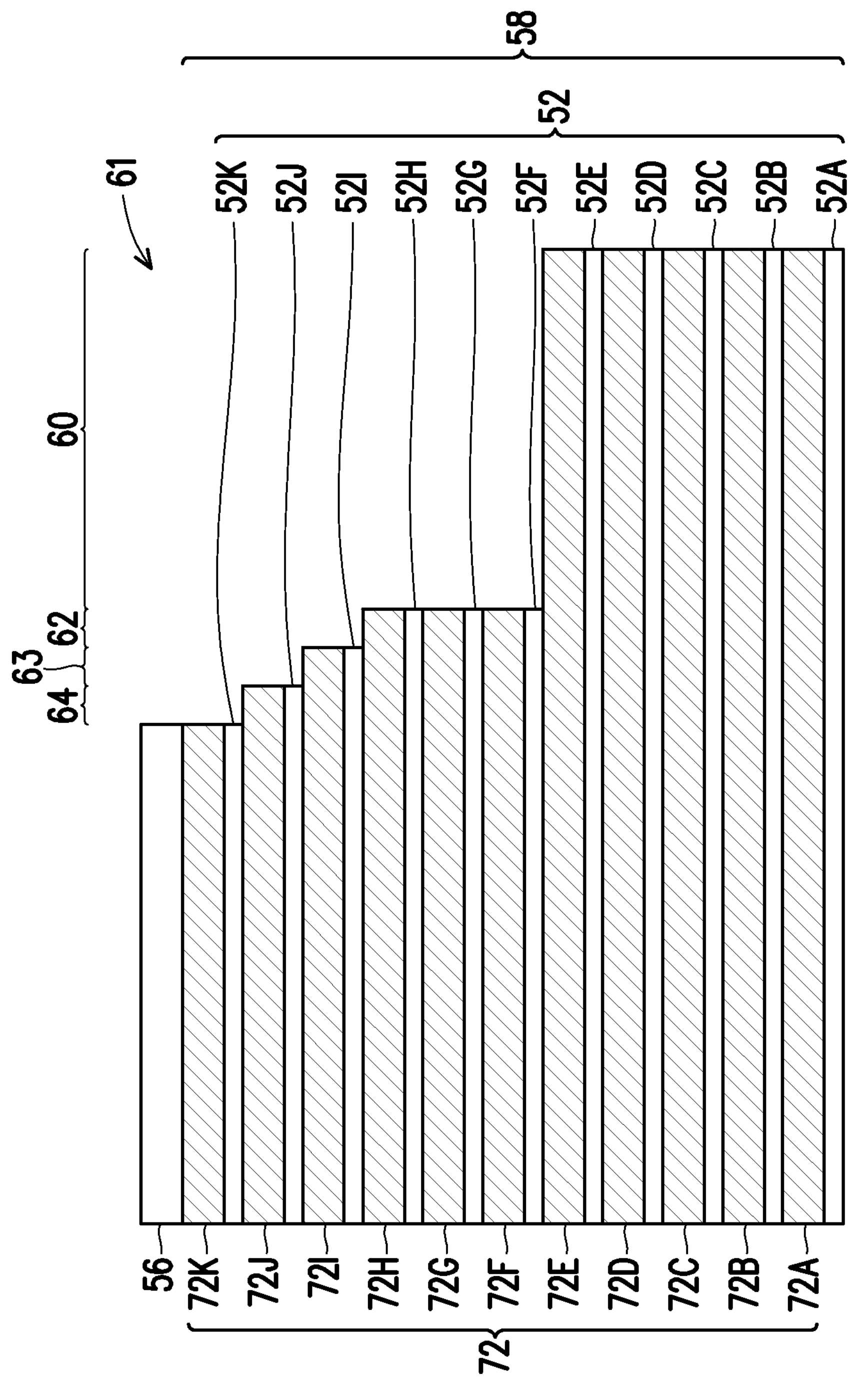

In FIG. 18, the second patterned mask 56 is trimmed to expose additional portions of the multi-layer stack 58. The second patterned mask 56 can be trimmed using acceptable photolithography techniques. As a result of the trimming, a width of the second patterned mask 56 is reduced, and portions the multi-layer stack 58 in the region 60, the region 62, the region 63, and a region 64 are exposed. For example, top surfaces of the conductive lines 72K in the region 64, top surfaces of the conductive lines 72J in the region 63, top surfaces of the conductive lines 72I in the region 62, and top surfaces of the conductive lines 72F in the region 60 may be exposed.

Exposed portions of the multi-layer stack 58 may then be etched using the second patterned mask 56 as a mask. The etching may be any suitable etching process, such as wet or dry etching, RIE, NBE, the like, or a combination thereof. The etching process may be anisotropic. The etching may extend the fourth openings 61 further into the multi-layer stack 58. Because the conductive lines 72 and the dielectric layers 52 have different material compositions, etchants used to remove exposed portions of these layers may be different. In some embodiments, the dielectric layers 52 act as etch stop layers while etching the conductive lines 72, and the conductive lines 72 acts as etch stop layers while etching dielectric layers 52. As a result, the portions of the conductive lines 72 and the dielectric layers 52 may be selectively removed without removing remaining layers of the multi-layer stack 58, and the fourth openings 61 may be extended to a desired depth. Alternatively, timed etch processes may be used to stop the etching of the fourth openings 61 after the fourth openings 61 reach a desired depth. Further, during the etching process, unetched portions of the conductive lines 72 and the dielectric layers 52 act as masks for underlying layers, and as a result a previous pattern of the conductive lines 72K-72G and the dielectric layers 52K-52G (see FIG. 17) may be transferred to the underlying conductive lines 72J, 72I, and 72F and the underlying dielectric layers 52J, 52I, and 52F. In the resulting structure, the conductive lines 72J are exposed in the region 64, the conductive lines 72I are exposed in the region 63, the conductive lines 72H are exposed in the region 62, and the conductive lines 72E are exposed in the region 60.

Figure 19:
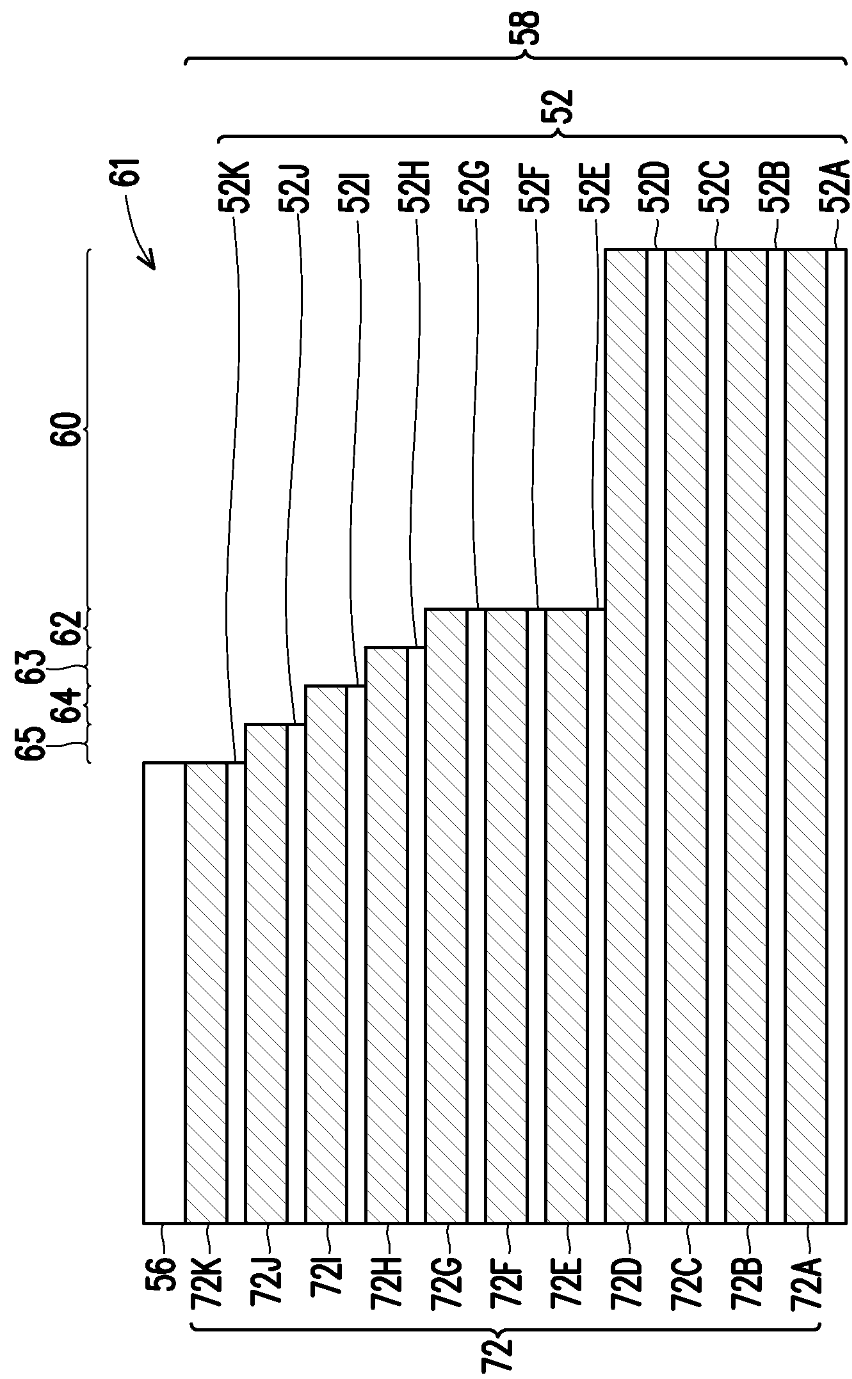

In FIG. 19, the second patterned mask 56 is trimmed to expose additional portions of the multi-layer stack 58. The second patterned mask 56 can be trimmed using acceptable photolithography techniques. As a result of the trimming, a width of the second patterned mask 56 is reduced, and portions the multi-layer stack 58 in the region 60, the region 62, the region 63, the region 64, and a region 65 are exposed. For example, top surfaces of the conductive lines 72K in the region 65, top surfaces of the conductive lines 72J in the region 64, top surfaces of the conductive lines 72I in the region 63, top surfaces of the conductive lines 72H in the region 62, and top surfaces of the conductive lines 72E in the region 60 may be exposed.

Exposed portions of the multi-layer stack 58 may then be etched using the second patterned mask 56 as a mask. The etching may be any suitable etching process, such as wet or dry etching, RIE, NBE, the like, or a combination thereof. The etching process may be anisotropic. The etching may extend the fourth openings 61 further into the multi-layer stack 58. Because the conductive lines 72 and the dielectric layers 52 have different material compositions, etchants used to remove exposed portions of these layers may be different. In some embodiments, the dielectric layers 52 act as etch stop layers while etching the conductive lines 72, and the conductive lines 72 acts as etch stop layers while etching dielectric layers 52. As a result, the portions of the conductive lines 72 and the dielectric layers 52 may be selectively removed without removing remaining layers of the multi-layer stack 58, and the fourth openings 61 may be extended to a desired depth. Alternatively, timed etch processes may be used to stop the etching of the fourth openings 61 after the fourth openings 61 reach a desired depth. Further, during the etching process, unetched portions of the conductive lines 72 and the dielectric layers 52 act as masks for underlying layers, and as a result a previous pattern of the conductive lines 72K-72F and the dielectric layers 52K-52F (see FIG. 18) may be transferred to the underlying conductive lines 72J, 72I, 72H, and 72E and the underlying dielectric layers 52J, 52I, 52H, and 52E. In the resulting structure, the conductive lines 72J are exposed in the region 65, the conductive lines 72I are exposed in the region 64, the conductive lines 72H are exposed in the region 63, the conductive lines 72G are exposed in the region 62, and the conductive lines 72D are exposed in the region 60.

Figure 20:
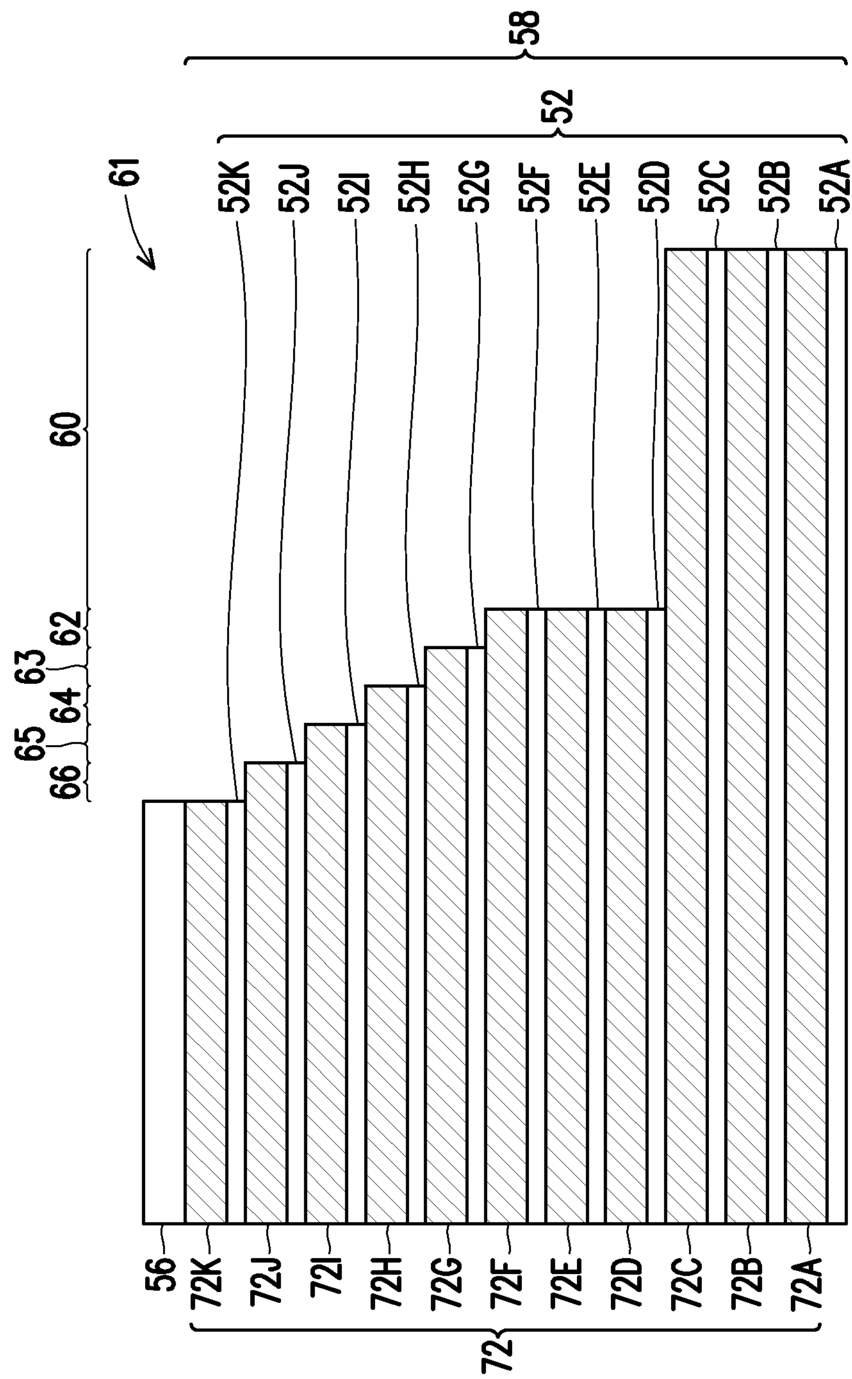

In FIG. 20, the second patterned mask 56 is trimmed to expose additional portions of the multi-layer stack 58. The second patterned mask 56 can be trimmed using acceptable photolithography techniques. As a result of the trimming, a width of the second patterned mask 56 is reduced, and portions the multi-layer stack 58 in the region 60, the region 62, the region 63, the region 64, the region 65, and a region 66 are exposed. For example, top surfaces of the conductive lines 72K in the region 66, top surfaces of the conductive lines 72J in the region 65, top surfaces of the conductive lines 72I in the region 64, top surfaces of the conductive lines 72H in the region 63, top surfaces of the conductive lines 72G in the region 62, and top surfaces of the conductive lines 72D in the region 60 may be exposed.

Exposed portions of the multi-layer stack 58 may then be etched using the second patterned mask 56 as a mask. The etching may be any suitable etching process, such as wet or dry etching, RIE, NBE, the like, or a combination thereof. The etching process may be anisotropic. The etching may extend the fourth openings 61 further into the multi-layer stack 58. Because the conductive lines 72 and the dielectric layers 52 have different material compositions, etchants used to remove exposed portions of these layers may be different. In some embodiments, the dielectric layers 52 act as etch stop layers while etching the conductive lines 72, and the conductive lines 72 acts as etch stop layers while etching dielectric layers 52. As a result, the portions of the conductive lines 72 and the dielectric layers 52 may be selectively removed without removing remaining layers of the multi-layer stack 58, and the fourth openings 61 may be extended to a desired depth. Alternatively, timed etch processes may be used to stop the etching of the fourth openings 61 after the fourth openings 61 reach a desired depth. Further, during the etching process, unetched portions of the conductive lines 72 and the dielectric layers 52 act as masks for underlying layers, and as a result a previous pattern of the conductive lines 72K-72E and the dielectric layers 52K-52E (see FIG. 19) may be transferred to the underlying conductive lines 72J, 72I, 72H, 72G, and 72D and the underlying dielectric layers 52J, 52I, 52H, 52G, and 52D. In the resulting structure, the conductive lines 72J are exposed in the region 66, the conductive lines 72I are exposed in the region 65, the conductive lines 72H are exposed in the region 64, the conductive lines 72G are exposed in the region 63, the conductive lines 72F are exposed in the region 62, and the conductive lines 72C are exposed in the region 60.

Figure 21:
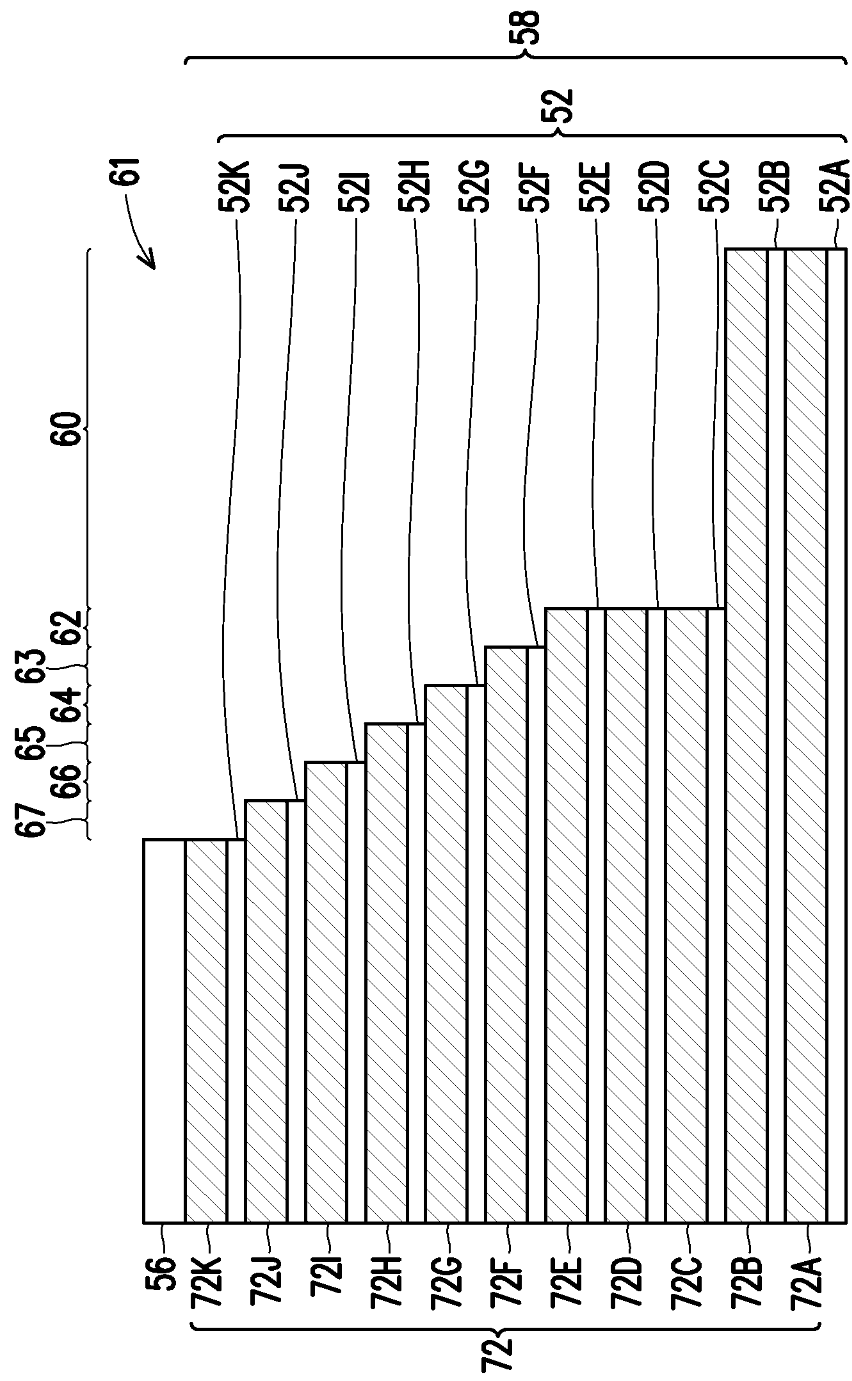

In FIG. 21, the second patterned mask 56 is trimmed to expose additional portions of the multi-layer stack 58. The second patterned mask 56 can be trimmed using acceptable photolithography techniques. As a result of the trimming, a width of the second patterned mask 56 is reduced, and portions the multi-layer stack 58 in the region 60, the region 62, the region 63, the region 64, the region 65, the region 66, and a region 67 are exposed. For example, top surfaces of the conductive lines 72K in the region 67, top surfaces of the conductive lines 72J in the region 66, top surfaces of the conductive lines 72I in the region 65, top surfaces of the conductive lines 72H in the region 64, top surfaces of the conductive lines 72G in the region 63, top surfaces of the conductive lines 72F in the region 62, and top surfaces of the conductive lines 72C in the region 60 may be exposed.

Exposed portions of the multi-layer stack 58 may then be etched using the second patterned mask 56 as a mask. The etching may be any suitable etching process, such as wet or dry etching, RIE, NBE, the like, or a combination thereof. The etching process may be anisotropic. The etching may extend the fourth openings 61 further into the multi-layer stack 58. Because the conductive lines 72 and the dielectric layers 52 have different material compositions, etchants used to remove exposed portions of these layers may be different. In some embodiments, the dielectric layers 52 act as etch stop layers while etching the conductive lines 72, and the conductive lines 72 acts as etch stop layers while etching dielectric layers 52. As a result, the portions of the conductive lines 72 and the dielectric layers 52 may be selectively removed without removing remaining layers of the multi-layer stack 58, and the fourth openings 61 may be extended to a desired depth. Alternatively, timed etch processes may be used to stop the etching of the fourth openings 61 after the fourth openings 61 reach a desired depth. Further, during the etching process, unetched portions of the conductive lines 72 and the dielectric layers 52 act as masks for underlying layers, and as a result a previous pattern of the conductive lines 72K-72D and the dielectric layers 52K-52D (see FIG. 20) may be transferred to the underlying conductive lines 72J, 72I, 72H, 72G, 72F, and 72C and the underlying dielectric layers 52J, 52I, 52H, 52G, 52F, and 52C. In the resulting structure, the conductive lines 72J are exposed in the region 67, the conductive lines 72I are exposed in the region 66, the conductive lines 72H are exposed in the region 65, the conductive lines 72G are exposed in the region 64, the conductive lines 72F are exposed in the region 63, the conductive lines 72E are exposed in the region 62, and the conductive lines 72B are exposed in the region 60.

Figure 22:
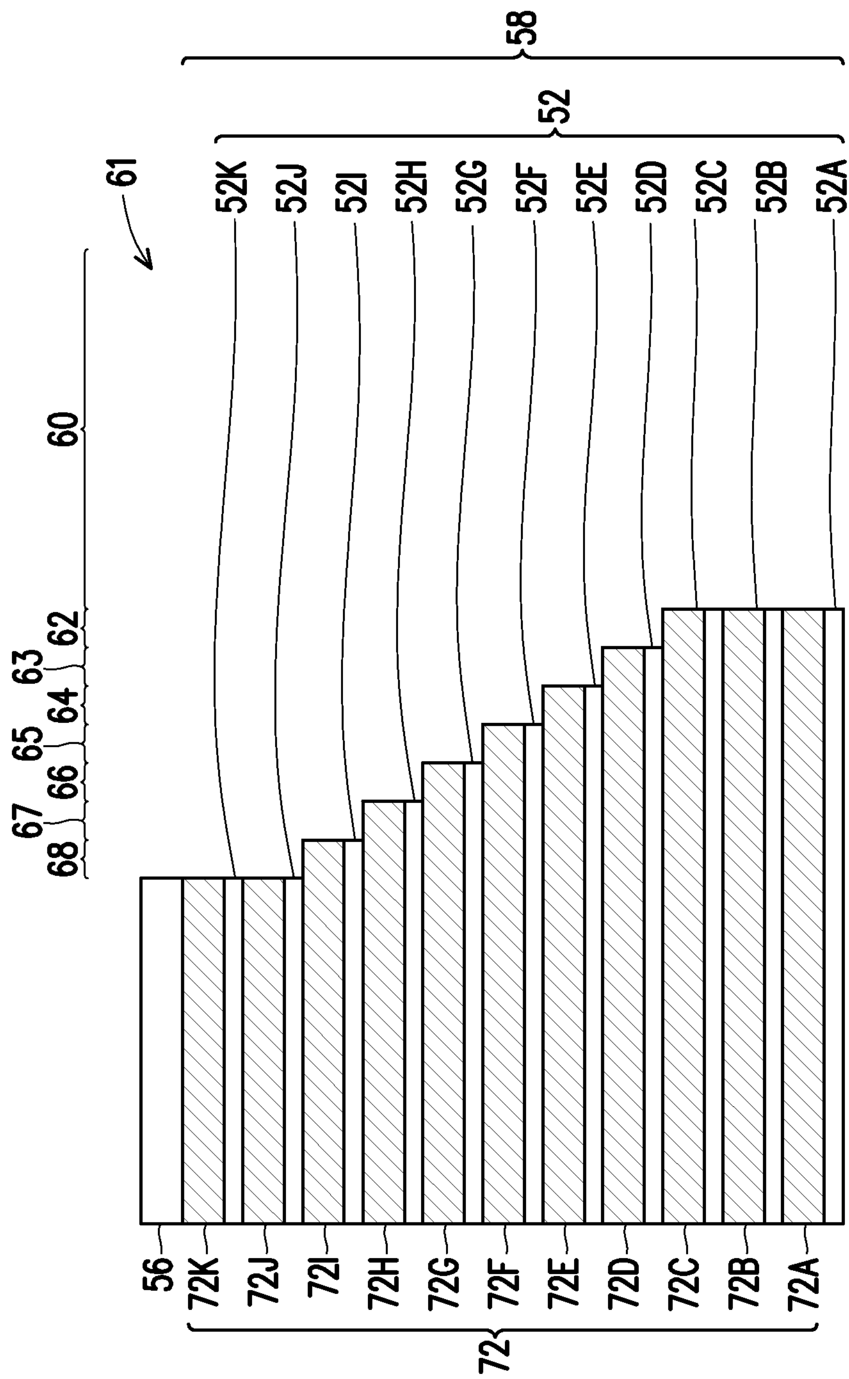

In FIG. 22, the second patterned mask 56 is trimmed to expose additional portions of the multi-layer stack 58. The second patterned mask 56 can be trimmed using acceptable photolithography techniques. As a result of the trimming, a width of the second patterned mask 56 is reduced, and portions the multi-layer stack 58 in the region 60, the region 62, the region 63, the region 64, the region 65, the region 66, the region 67, and a region 68 are exposed. For example, top surfaces of the conductive lines 72K in the region 68, top surfaces of the conductive lines 72J in the region 67, top surfaces of the conductive lines 72I in the region 66, top surfaces of the conductive lines 72H in the region 65, top surfaces of the conductive lines 72G in the region 64, top surfaces of the conductive lines 72F in the region 63, top surfaces of the conductive lines 72E in the region 62, and top surfaces of the conductive lines 72B in the region 60 may be exposed.

Exposed portions of the multi-layer stack 58 may then be etched using the second patterned mask 56 as a mask. The etching may be any suitable etching process, such as wet or dry etching, RIE, NBE, the like, or a combination thereof. The etching process may be anisotropic. The etching may extend the fourth openings 61 further into the multi-layer stack 58. Because the conductive lines 72 and the dielectric layers 52 have different material compositions, etchants used to remove exposed portions of these layers may be different. In some embodiments, the dielectric layers 52 act as etch stop layers while etching the conductive lines 72, and the conductive lines 72 acts as etch stop layers while etching dielectric layers 52. As a result, the portions of the conductive lines 72 and the dielectric layers 52 may be selectively removed without removing remaining layers of the multi-layer stack 58, and the fourth openings 61 may be extended to a desired depth. Alternatively, timed etch processes may be used to stop the etching of the fourth openings 61 after the fourth openings 61 reach a desired depth. Further, during the etching process, unetched portions of the conductive lines 72 and the dielectric layers 52 act as masks for underlying layers, and as a result a previous pattern of the conductive lines 72K-72C and the dielectric layers 52K-52C (see FIG. 21) may be transferred to the underlying conductive lines 72I, 72H, 72G, 72F, 72E, 72D, 72B, and 72A and the underlying dielectric layers 52I, 52H, 52G, 52F, 52E, 52D, 52B, and 52A. In the resulting structure, the conductive lines 72I are exposed in the region 68, the conductive lines 72H are exposed in the region 67, the conductive lines 72G are exposed in the region 66, the conductive lines 72F are exposed in the region 65, the conductive lines 72E are exposed in the region 64, the conductive lines 72D are exposed in the region 63, the conductive lines 72C are exposed in the region 62, and the substrate 50 is exposed in the region 60.

Figure 23A:
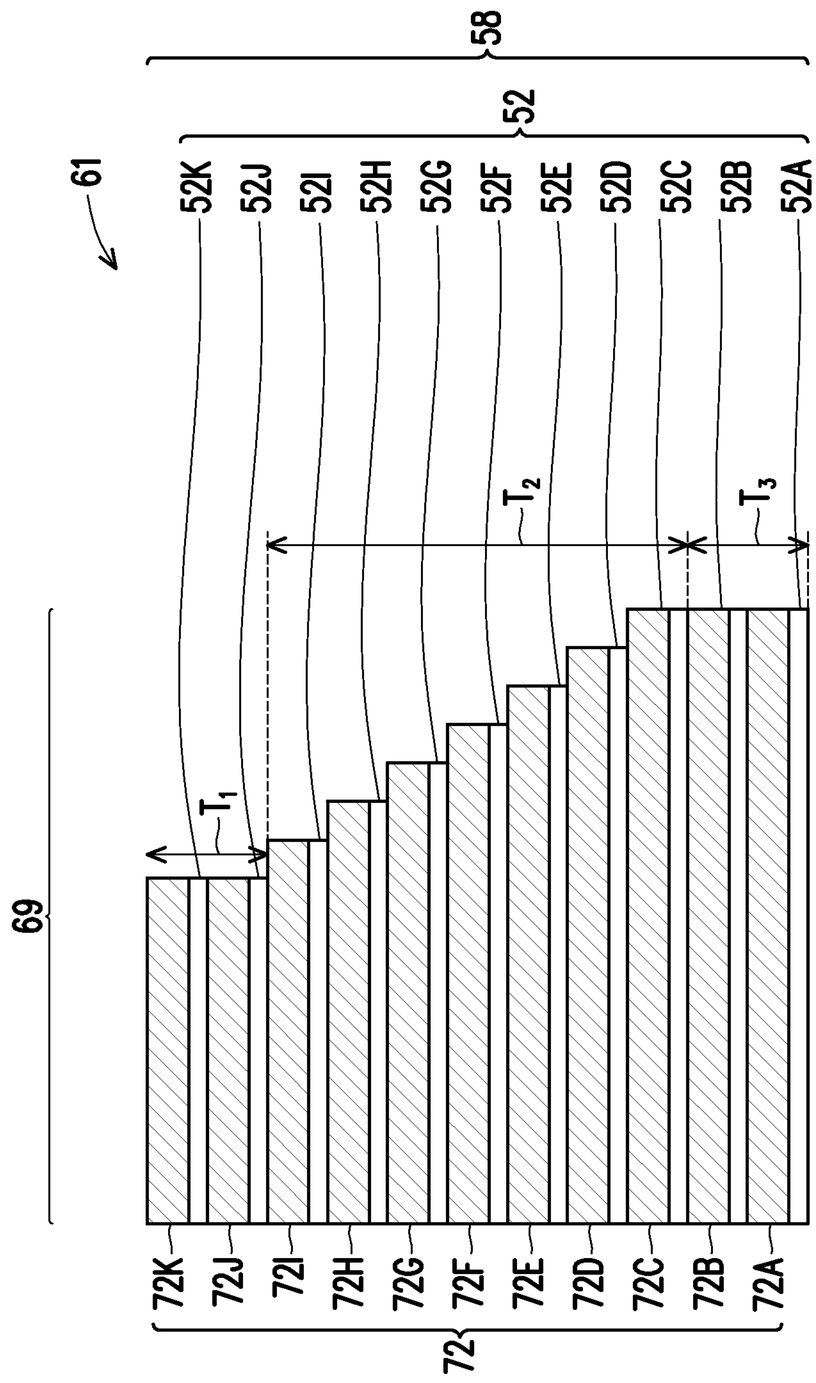
Figure 23B:
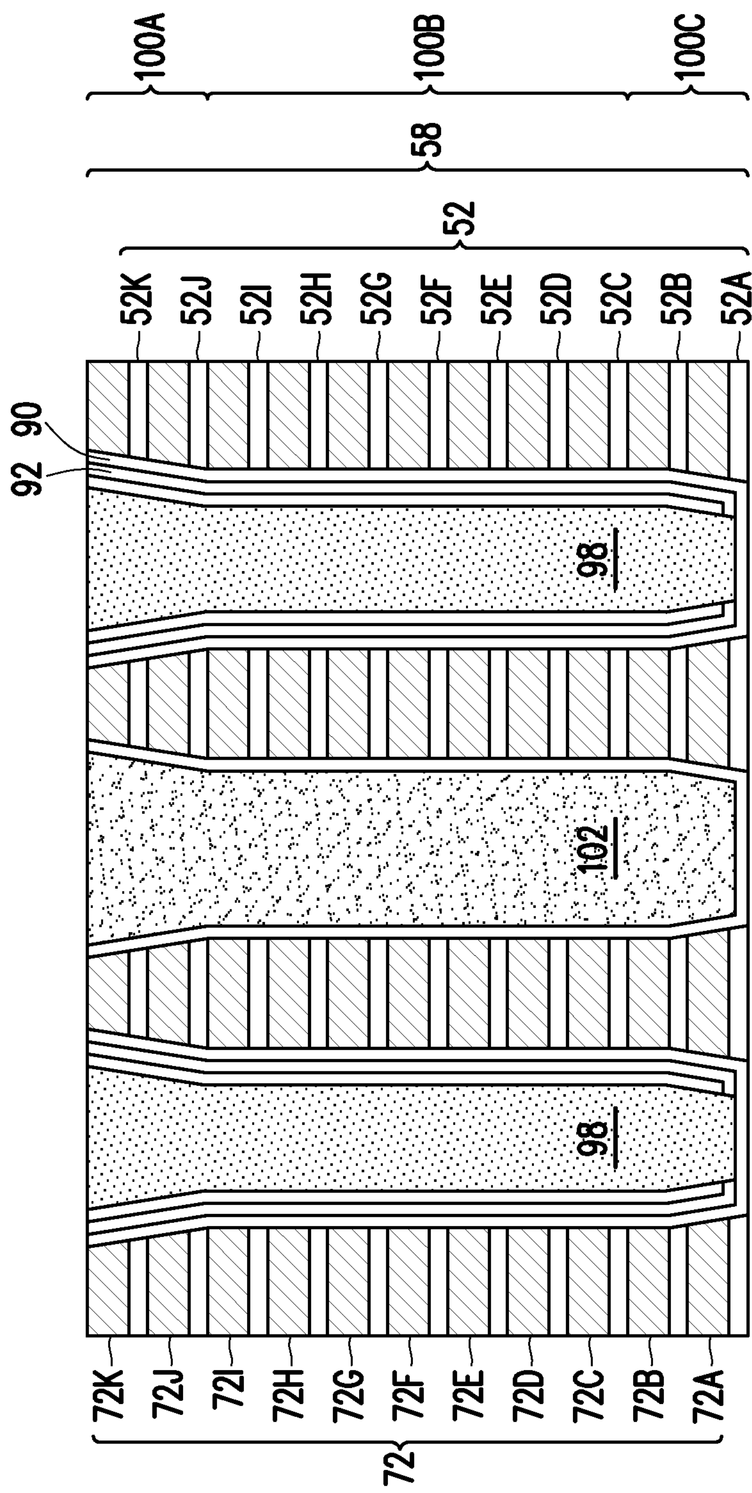
Figure 23C:
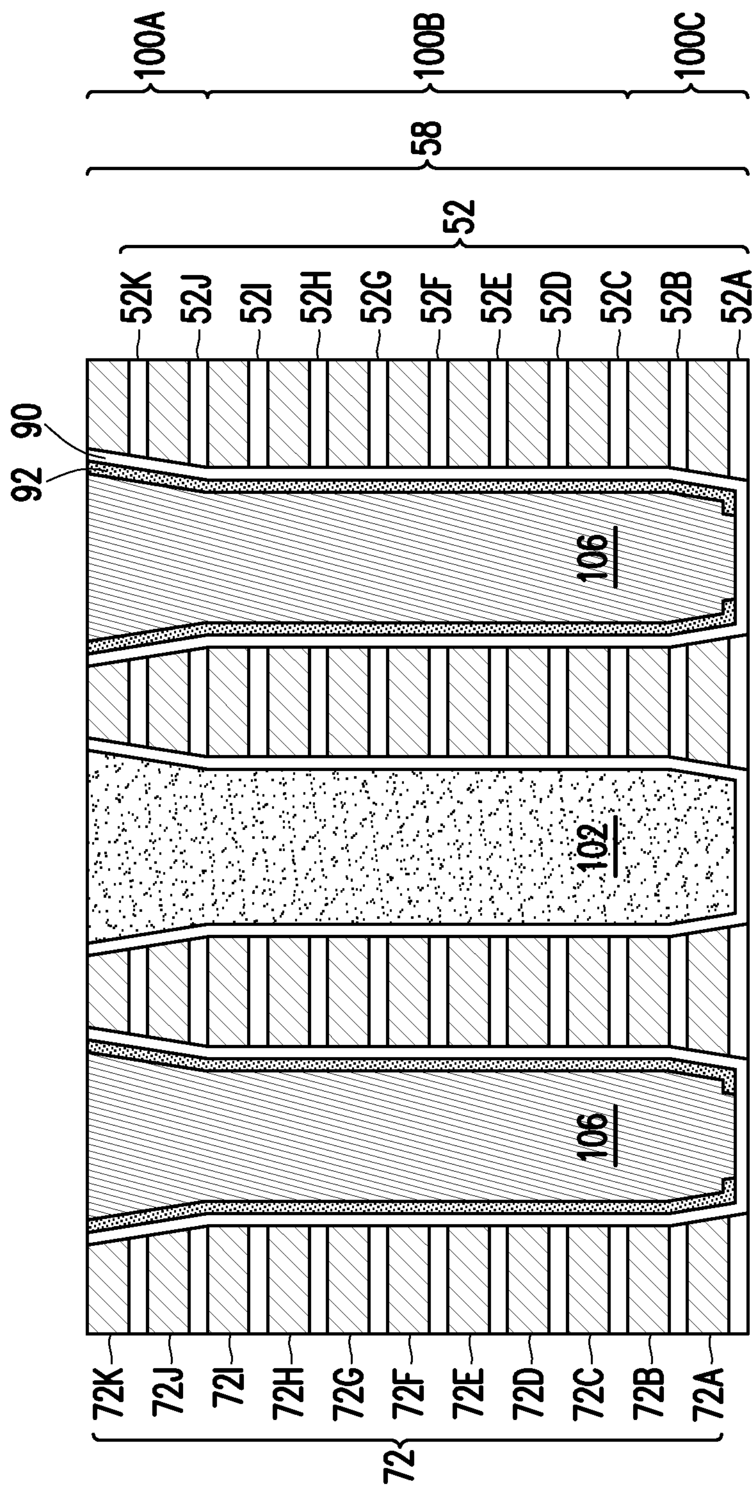

In FIGS. 23A through 23C, the second patterned mask 56 may be removed, such as by an acceptable ashing or wet strip process. Thus, a staircase structure 69 is formed. The staircase structure 69 comprises a stack of alternating layers of the dielectric layers 52 and the conductive lines 72. Lower conductive lines 72 are longer and extend laterally past upper conductive lines 72. Specifically, the conductive lines 72C are longer than the conductive lines 72D, the conductive lines 72D are longer than the conductive lines 72E, the conductive lines 72E are longer than the conductive lines 72F, the conductive lines 72F are longer than the conductive lines 72G, the conductive lines 72G are longer than the conductive lines 72H, the conductive lines 72H are longer than the conductive lines 72I, and the conductive lines 72I are longer than the conductive lines 72J and 72K. As a result, conductive contacts can be made from above the staircase structure 69 to each of the conductive lines 72 in subsequent processing steps.

As illustrated in FIGS. 23B and 23C, first portions of the FE materials 90, the OS layer 92, the first dielectric materials 98, the second dielectric materials 102, the conductive lines 106, and the conductive lines 108 (not separately illustrated, but which may be similar to the conductive lines 106) are formed adjacent sidewalls of the conductive lines 72K, 72I, and 72A and the dielectric layers 52K, 52I, 52B, and 52A which have tapered profiles. This may cause the first portions of the FE materials 90, the OS layer 92, the first dielectric materials 98, the second dielectric materials 102, the conductive lines 106, and the conductive lines 108 to have tapered sidewalls, and may also lead to thickness variations in the first portions of the FE materials 90, the OS layer 92, the first dielectric materials 98, the second dielectric materials 102, the conductive lines 106, and the conductive lines 108 and the like. Forming the transistors 204 in the first portions of the FE materials 90, the OS layer 92, the first dielectric materials 98, the second dielectric materials 102, the conductive lines 106, and the conductive lines 108 having the tapered profiles may result in the transistors 204 having device characteristics (e.g., threshold voltage and the like) which vary between the transistors 204 disposed at different vertical levels of the memory array 200. As such, the conductive lines 72K, 72J, 72B, and 72A may be dummy conductive lines, which are not connected to the conductive contacts or the active devices on the substrate 50 (see e.g., FIG. 3), and transistors formed in the conductive lines 72K, 72I, 72B, and 72A and the dielectric layers 52K, 52I, 52B, and 52A may be dummy transistors (e.g., non-functional transistors or devices), which are not connected to the conductive contacts or the active devices on the substrate 50 (see e.g., FIG. 3). The conductive lines 72K and 72J and the dielectric layers 52K and 52J may be collectively referred to as a top dummy region 100A and the conductive lines 72B and 72A and the dielectric layers 52A and 52B may be collectively referred to as a bottom dummy region 100C.

As further illustrated in FIGS. 23B and 23C, second portions of the FE materials 90, the OS layer 92, the first dielectric materials 98, the second dielectric materials 102, the conductive lines 106, and the conductive lines 108 (not separately illustrated, but which may be similar to the conductive lines 106) are formed adjacent sidewalls of the conductive lines 72B-72I and the dielectric layers 52C-52I which have substantially vertical sidewalls. The second portions of the FE materials 90, the OS layer 92, the first dielectric materials 98, the second dielectric materials 102, the conductive lines 106, and the conductive lines 108 may have vertical sidewalls and consistent thicknesses. This results in devices formed in the second portions of the FE materials 90, the OS layer 92, the first dielectric materials 98, the second dielectric materials 102, the conductive lines 106, and the conductive lines 108 having reduced variations in device characteristics as compared with devices formed in the first portions of the FE materials 90, the OS layer 92, the first dielectric materials 98, the second dielectric materials 102, the conductive lines 106, and the conductive lines 108. As will be discussed in greater detail below, the conductive contacts may be formed extending to the conductive lines 72C-72I, such that functional transistors (e.g., the transistors 204) and functional memory cells (e.g., the memory cells 202) are formed in the conductive lines 72C-72I and the second portions of the FE materials 90, the OS layer 92, the first dielectric materials 98, the second dielectric materials 102, the conductive lines 106, and the conductive lines 108. This may cause the transistors 204 and the memory cells 202 to have reduced device variations, reduced device defects, and improved performance. The conductive lines 72I-72C and the dielectric layers 52I-52C may be collectively referred to as a functional memory cell region 100B. Moreover, forming the conductive lines 72K and 72J with the same lengths and forming the conductive lines 72B and 72A with the same lengths as the conductive lines 72C reduces the number of patterning steps required to form the staircase structure 69, reducing production time and cost.

As illustrated in FIG. 23A, the conductive lines 72K and 72J and the dielectric layers 52K and 52J (e.g., the top dummy region 100A) may have a combined thickness $T_1$, the conductive lines 72I-72C and the dielectric layers 52I-52C (e.g., the functional memory cell region 100B) may have a combined thickness $T_2$, and the conductive lines 72B and 72A and the dielectric layers 52A and 52B (e.g., the bottom dummy region 100C) may have a combined thickness $T_3$. The thickness $T_1$ may range from about 50 nm to about 300 nm, the thickness $T_2$ may range from about 500 nm to about 5,000 nm, and the thickness $T_3$ may range from about 50 nm to about 300 nm. In some embodiments, the thickness $T_1$ may be equal to the thickness $T_3$; however, in some embodiments the thickness $T_1$ may be greater than or less than the thickness $T_3$. A ratio of the thickness $T_1$ to the thickness $T_2$ may range from about 0.01 to about 0.6 and a ratio of the thickness $T_3$ to the thickness $T_2$ may range from about 0.01 to about 0.6. Although FIG. 23A illustrates two pairs of conductive lines 72 and dielectric layers 52 in the top dummy region 100A, two pairs of conductive lines 72 and dielectric layers 52 in the bottom dummy region 100C, and seven pairs of conductive lines 72 and dielectric layers 52 in the functional memory cell region 100B, any number of pairs of the conductive lines 72 and the dielectric layers 52 may be included in each of the top dummy region 100A, the functional memory cell region 100B, and the bottom dummy region 100C. Maintaining the thicknesses of the top dummy region 100A, the functional memory cell region 100B, and the bottom dummy region 100C in the above-described ranges ensures that the memory cells 202 are formed with reduced variations, while maintaining the area in which the memory cells 202 are formed.

Figure 24:
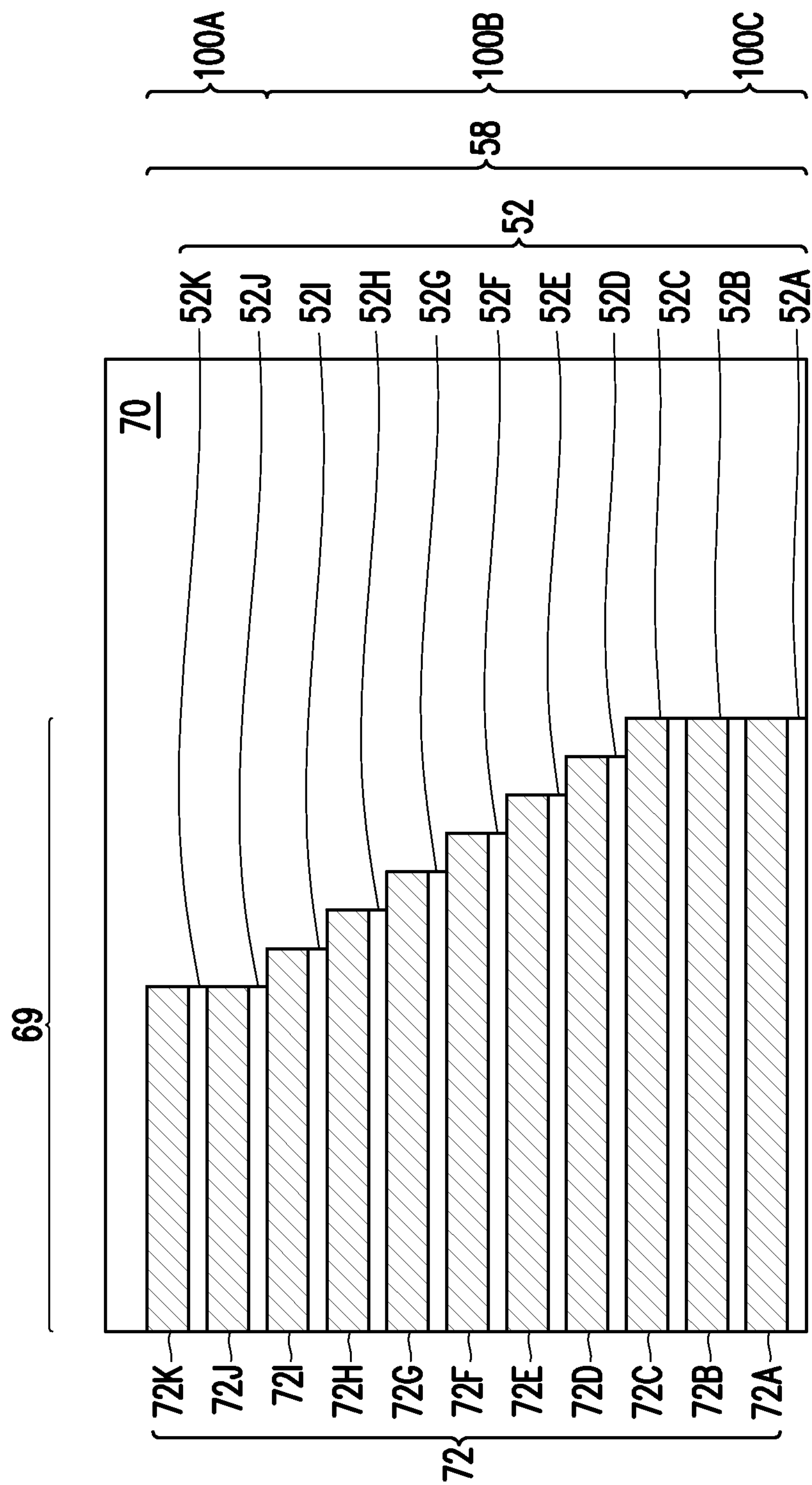

In FIG. 24, an inter-metal dielectric (IMD) 70 is deposited over the multi-layer stack 58. The IMD 70 may be formed of dielectric materials, and may be deposited by any suitable method, such as CVD, plasma-enhanced CVD (PECVD), or flowable CVD (FCVD). The dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. As illustrated in FIG. 24, the IMD 70 extends along sidewalls of the conductive lines 72A-72K, sidewalls of the dielectric layers 52A-52K, and top surfaces of the conductive lines 72C-72K.

Following the deposition of the IMD 70, a planarization process is applied to the IMD 70. In some embodiments, the planarization process may include a CMP, an etch-back process, combinations thereof, or the like. The planarization process may be used to planarize the top surface of the IMD 70. In some embodiments (not separately illustrated), the planarization process may be used to expose surfaces of the multi-layer stack 58. For example, the planarization process may be used to expose surfaces of the conductive lines 72K such that top surfaces of the conductive lines 72K are level with the top surface of the IMD 70.

In FIGS. 25A through 25D, contacts 110A-110G (collectively referred to as contacts 110) are formed extending to and electrically coupled to the conductive lines 72. The contacts 110 are electrically coupled to the conductive lines 72C-72I in the functional memory cell region 100B, while no contacts 110 are electrically coupled to the conductive lines 72A, 72B, 72J, and 72K in the bottom dummy region 100C and the top dummy region 100A. As such, the conductive lines 72A, 72B, 72J, and 72K may be dummy conductive lines. Moreover, devices formed in the bottom dummy region 100C and the top dummy region 100A, which are not electrically coupled to the contacts 110, may be non-functional devices.

Although not separately illustrated, the contacts 110 may be electrically coupled to metal lines which extend over the IMD 70. The metal lines may extend in directions parallel to a top surface of the IMD 70. The metal lines may be used to interconnect the contacts 110 and may provide connections to the underlying interconnect structure 320. The metal lines may be disposed in different cross-sections from those illustrated in FIGS. 25A through 25C. In some embodiments, the metal lines may be disposed in the IMD 70. The metal lines may be adjacent the contacts 110 and may be disposed at any level within the IMD 70.

Figure 25A:
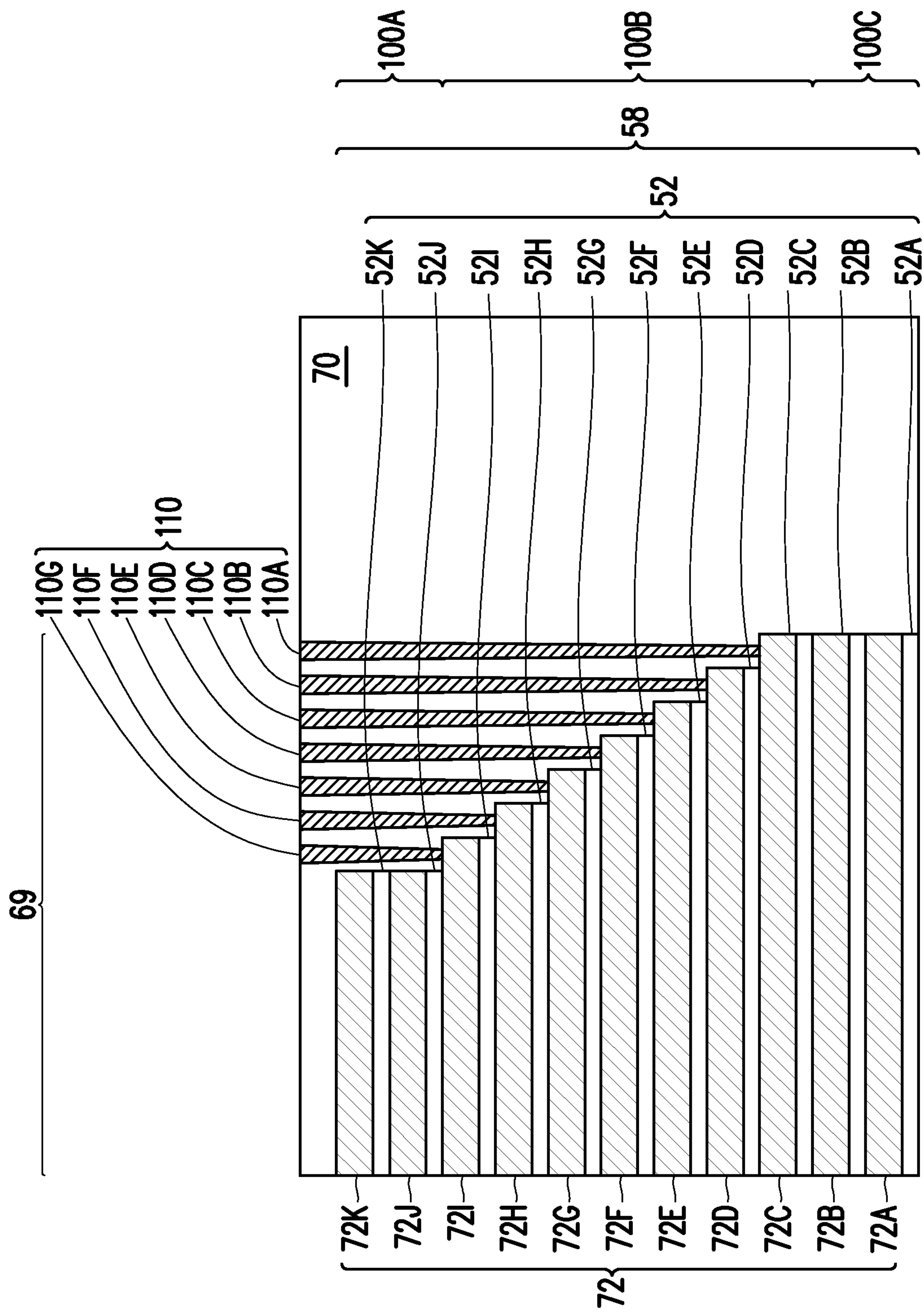
Figure 25B:
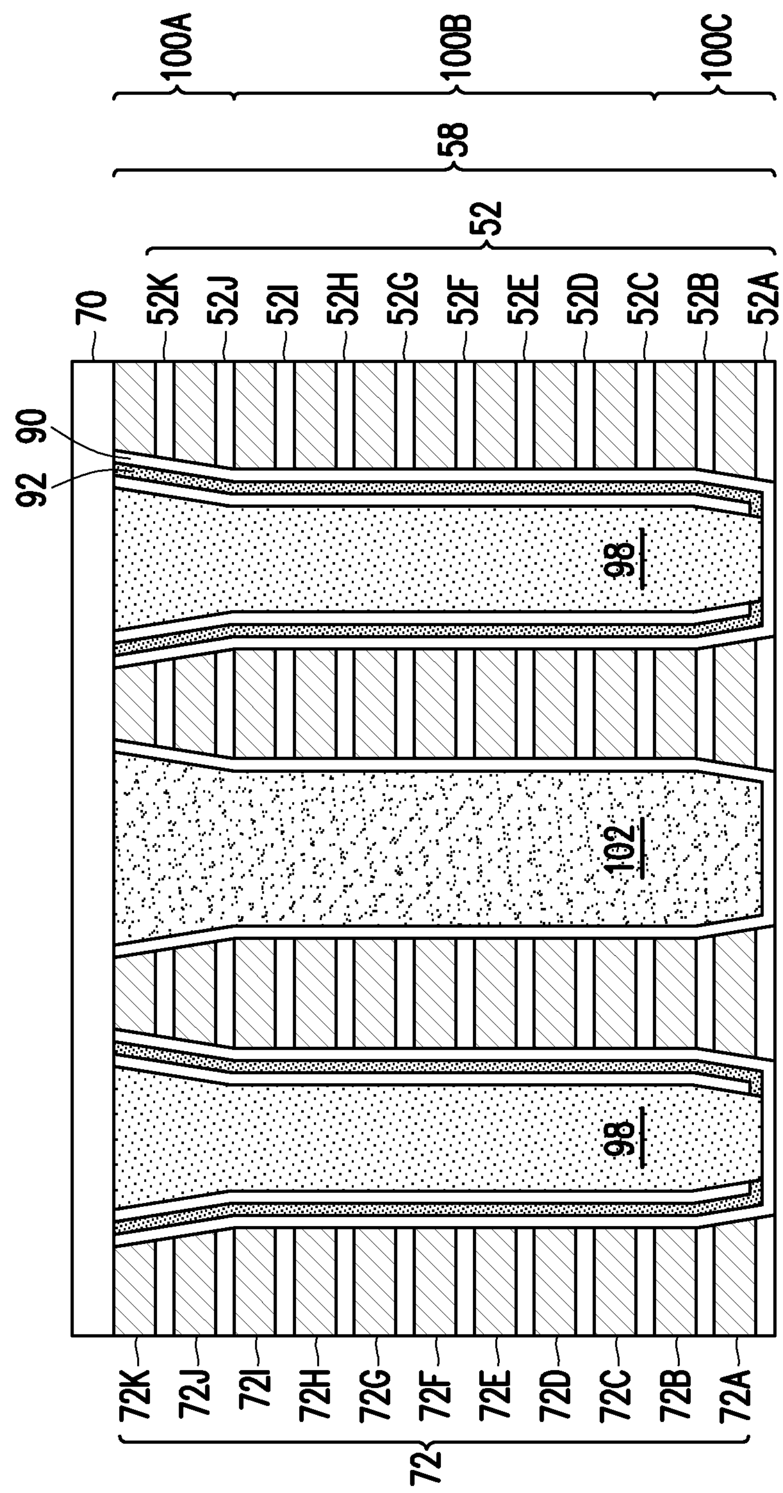
Figure 25C:
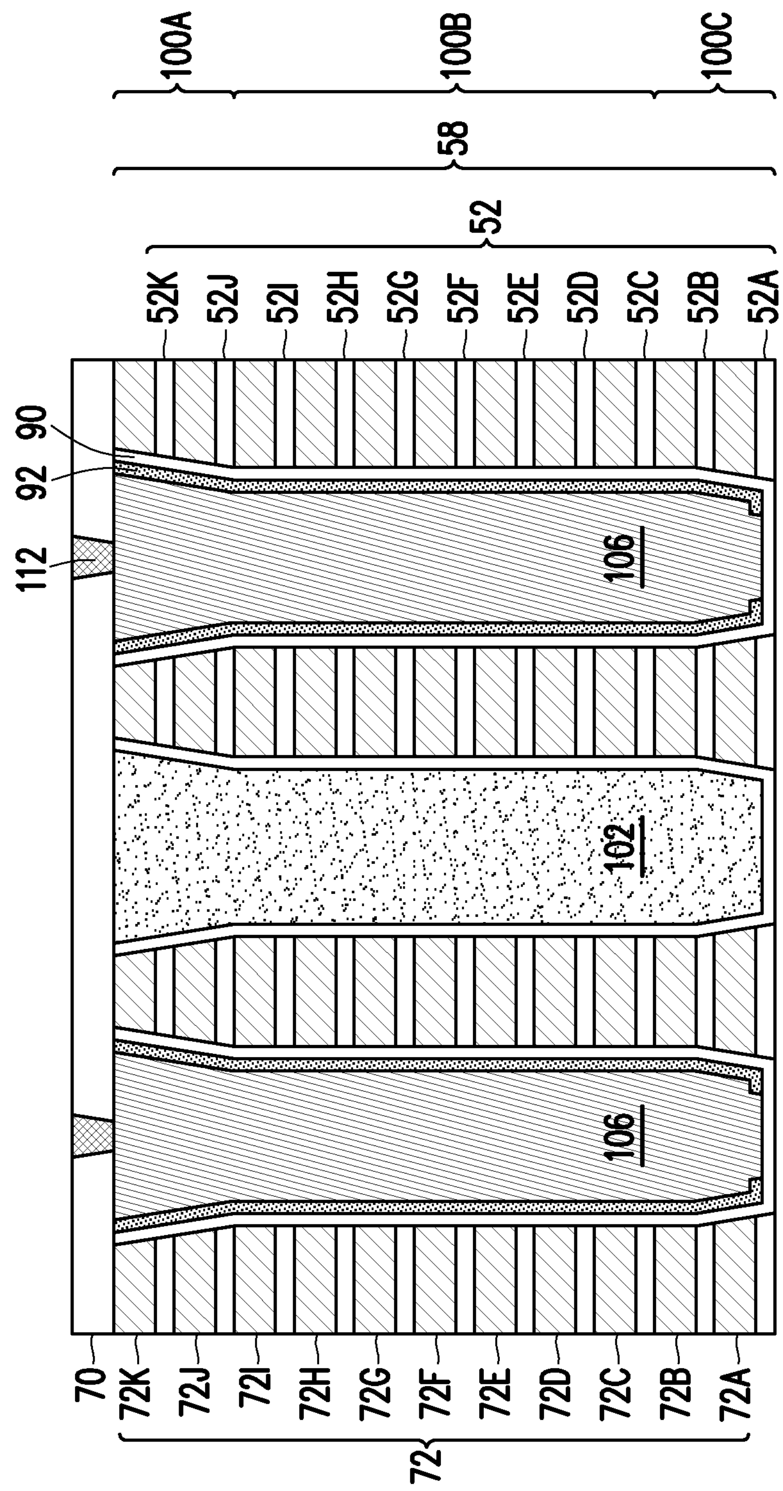
Figure 25D:
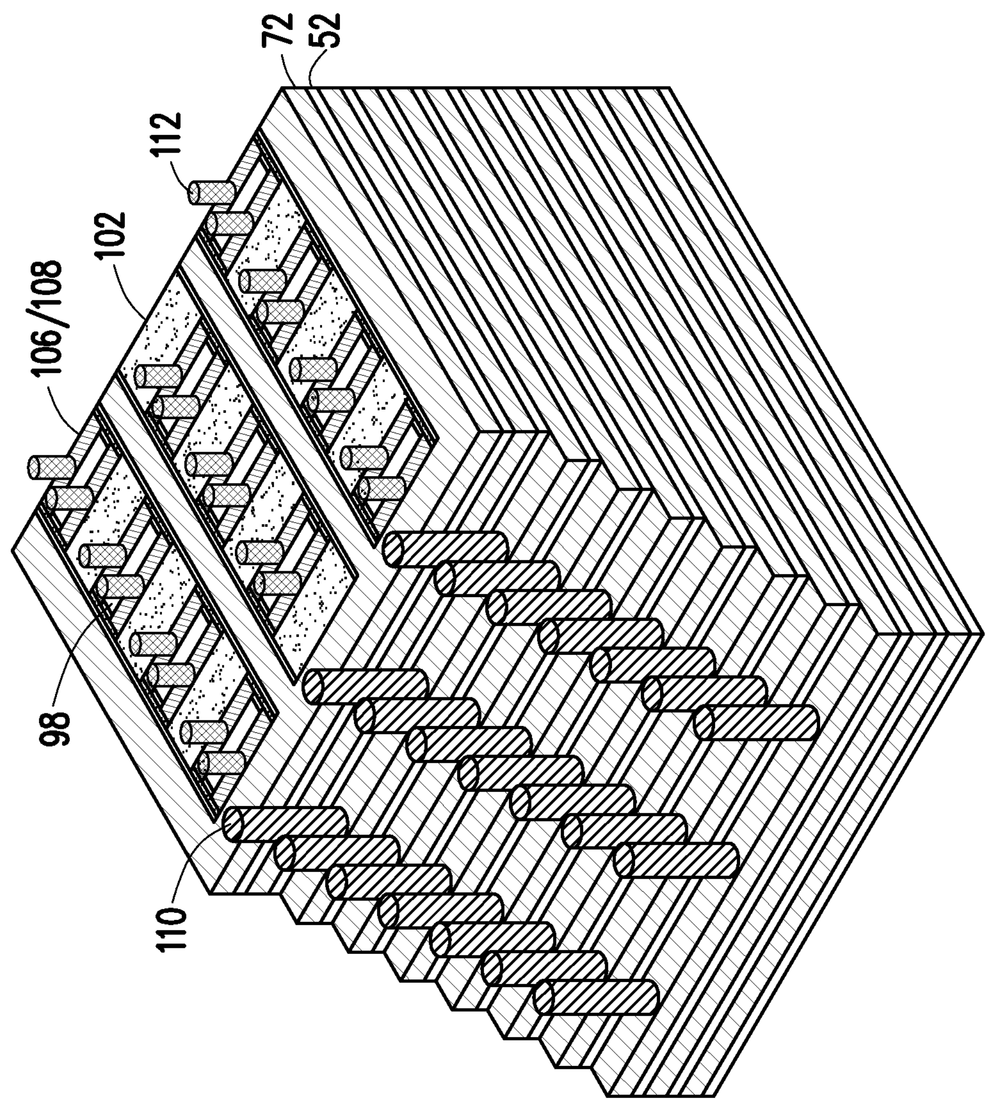

As illustrated in FIGS. 25A and 25D, the staircase shape of the conductive lines 72 provides surfaces on each of the conductive lines 72 for the contacts 110 to land on. For example, because the lengths of the respective conductive lines 72 increase in a direction towards an underlying substrate, portions of each underlying conductive line 72 are not covered by overlying conductive lines 72, and contacts 110 may extend to each of the conductive lines 72. Because the conductive lines 72A, 72B, 72J, and 72K are dummy conductive lines, the conductive lines 72A, 72B, 72J, and 72K may not be patterned in the staircase structure, which saves patterning steps and space in the completed device, reducing costs and increasing device density.

Forming the contacts 110 may include patterning openings in the IMD 70 to expose portions of the conductive lines 72 using a combination of photolithography and etching, for example. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the contacts 110 in the openings. As illustrated in FIG. 25A, the contacts 110A may extend to the conductive lines 72C, the contacts 110B may extend to the conductive lines 72D, the contacts 110C may extend to the conductive lines 72E, the contacts 110D may extend to the conductive lines 72F, the contacts 110E may extend to the conductive lines 72G, the contacts 110F may extend to the conductive lines 72H, and the contacts 110G may extend to the conductive lines 72I.

In the embodiment illustrated in FIG. 25A, the conductive lines 72K, 72J, 72B, and 72A are dummy conductive lines, which are not electrically coupled to contacts 110. As discussed previously, first portions of the FE materials 90, the OS layer 92, the first dielectric materials 98, the second dielectric materials 102, the conductive lines 106, and the conductive lines 108 (not separately illustrated, but which may be similar to the conductive lines 106) extending through the conductive lines 72K, 72J, 72B, and 72A may have tapered profiles. The devices formed in the conductive lines 72K, 72J, 72B, and 72A and the dielectric layers 52K, 52J, 52B, and 52A may be non-functional devices such that devices with variations and defects are not formed in these layers. Forming the memory cells 202 in the conductive lines 72C-72I and the dielectric layers 52C-52I ensures that the memory cells 202 are formed with reduced variations, reduced device defects, and improved device performance.

Further in FIGS. 25A through 25D, contacts 112 are formed extending to and electrically coupled to the conductive lines 106 and the conductive lines 108 (not separately illustrated, but which may be similar to the conductive lines 106). As illustrated in FIGS. 25B and 25C, the contacts 112 may be formed extending through the IMD 70. The contacts 112 may be formed using processes and materials the same as or similar to those used to form the contacts 110. The contacts 112 may be electrically coupled to metal lines (not separately illustrated) which extend over the IMD 70 in directions parallel to the top surface of the IMD 70. The metal lines may be used to interconnect the conductive lines 106 and the conductive lines 108 and may provide connections to the underlying interconnect structure 320.

Figure 26:
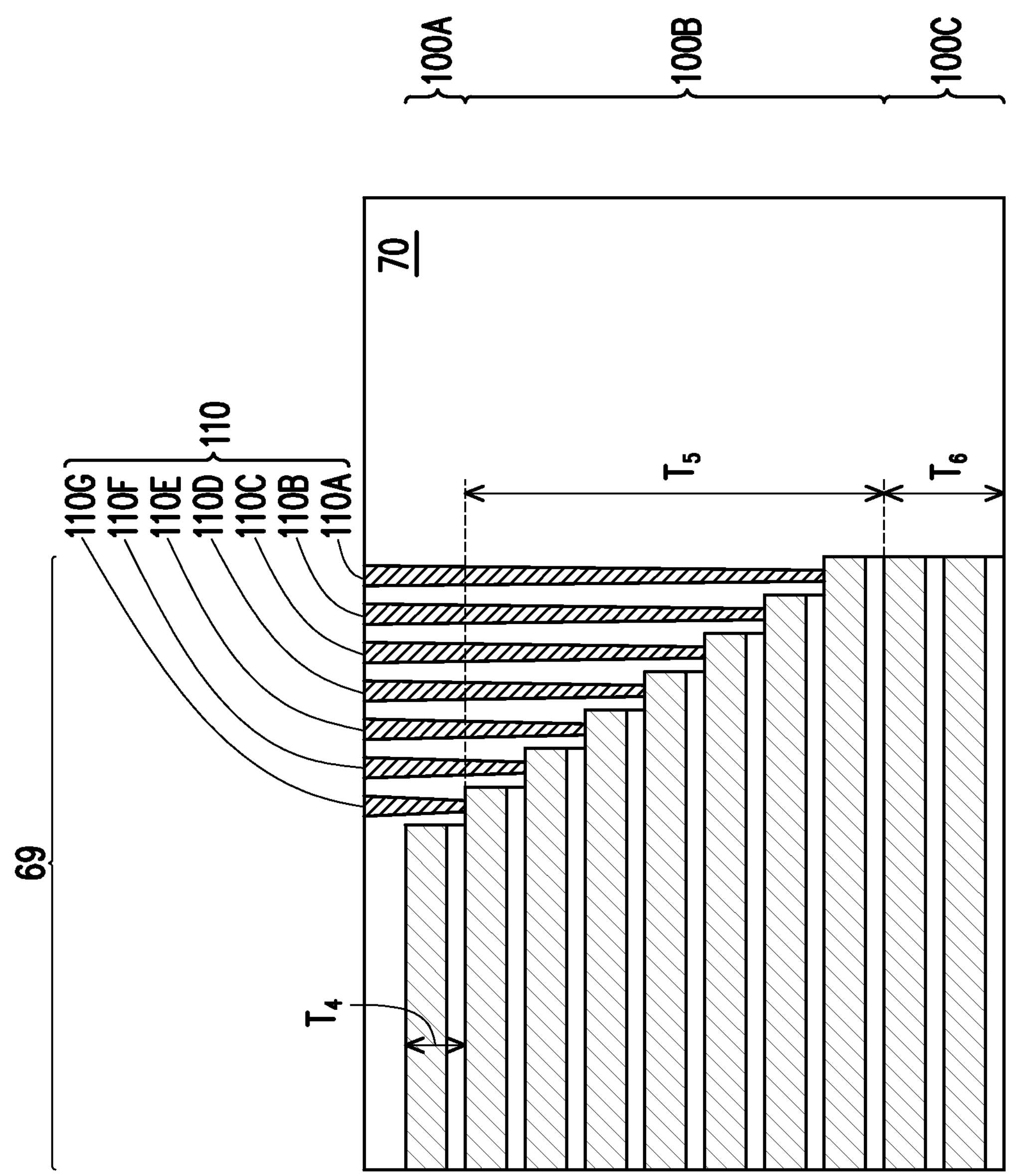

FIG. 26 illustrates an embodiment in which the top dummy region 100A includes only the conductive lines 72J and the dielectric layer 52J and the conductive lines 72K and the dielectric layer 52K are omitted. The contacts 110 are electrically coupled to the conductive lines 72C-72I in the functional memory cell region 100B, while no contacts 110 are electrically coupled to the conductive lines 72A, 72B, and 72J in the bottom dummy region 100C and the top dummy region 100A. As such, the conductive lines 72A, 72B, and 72J may be dummy conductive lines.

As illustrated in FIG. 26, the conductive lines 72J and the dielectric layer 52J may have a combined thickness $T_4$, the conductive lines 72I-72C and the dielectric layers 52I-52C may have a combined thickness $T_5$, and the conductive lines 72B and 72A and the dielectric layers 52A and 52B may have a combined thickness $T_6$. The thickness $T_4$ may range from about 50 nm to about 300 nm, the thickness $T_5$ may range from about 500 nm to about 5,000 nm, and the thickness $T_6$ may range from about 50 nm to about 300 nm. Although the thickness $T_4$ of the top dummy region 100A is illustrated as being greater than the thickness $T_6$ of the bottom dummy region 100C, the thickness $T_6$ may be equal to or greater than the thickness $T_4$. A ratio of the thickness $T_4$ to the thickness $T_5$ may range from about 0.01 to about 0.6 and a ratio of the thickness $T_6$ to the thickness $T_5$ may range from about 0.01 to about 0.6. Although FIG. 26 illustrates one pair of conductive lines 72 and dielectric layers 52 in the top dummy region 100A, two pairs of conductive lines 72 and dielectric layers 52 in the bottom dummy region 100C, and seven pairs of conductive lines 72 and dielectric layers 52 in the functional memory cell region 100B, any number of pairs of the conductive lines 72 and the dielectric layers 52 may be included in each of the top dummy region 100A, the functional memory cell region 100B, and the bottom dummy region 100C. For example, in some embodiments, the top dummy region 100A may include more pairs of the conductive lines 72 and the dielectric layers 52 than the bottom dummy region 100C.

Maintaining the thicknesses of the top dummy region 100A, the functional memory cell region 100B, and the bottom dummy region 100C in the above-described ranges ensures that the memory cells 202 are formed with reduced variations, while maintaining the area in which the memory cells 202 are formed. Moreover, the thicknesses of the top dummy region 100A and the bottom dummy region 100C may be set independent of one another based on heights of tapered portions of the first openings 86 in which the FE materials 90, the OS layer 92, the first dielectric materials 98, the second dielectric materials 102, the conductive lines 106, and the conductive lines 108 are formed.

Figure 27:
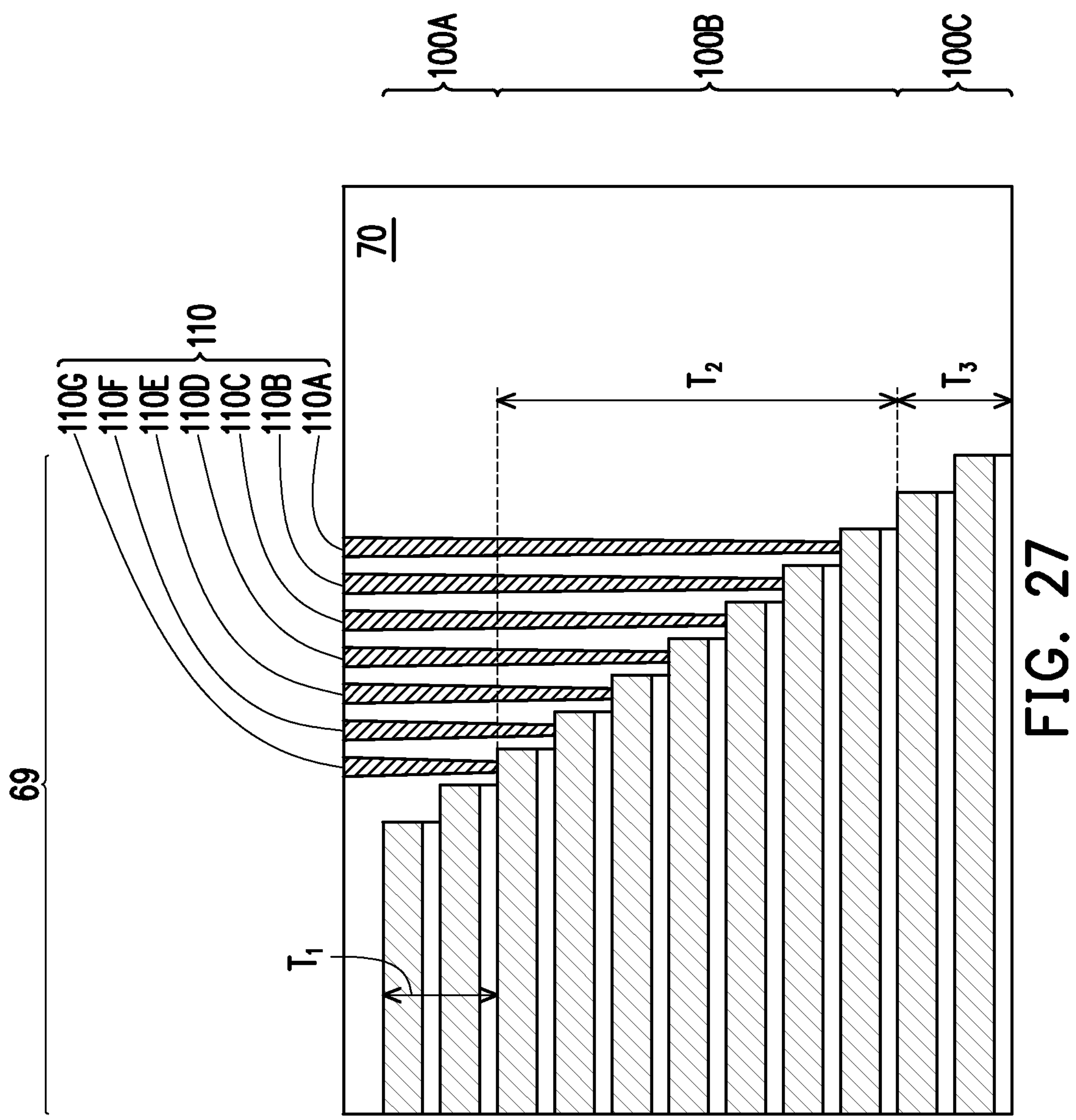

FIG. 27 illustrates an embodiment in which the staircase profile is continued in the conductive lines 72 and the dielectric layers 52 of the top dummy region 100A and the bottom dummy region 100C. For example, as illustrated in FIG. 27, the conductive lines 72K and the dielectric layers 52K may have lengths shorter than the conductive lines 72J and the dielectric layer 52J and the conductive lines 72A and the dielectric layers 52A may have lengths greater than the conductive lines 72B and the dielectric layer 52B. The contacts 110 are electrically coupled to the conductive lines 72C-72I in the functional memory cell region 100B, while no contacts 110 are electrically coupled to the conductive lines 72A, 72B, 72J, and 72I in the bottom dummy region 100C and the top dummy region 100A. As such, the conductive lines 72A, 72B, 72J, and 72K may be dummy conductive lines.

The thicknesses of the top dummy region 100A, the functional memory cell region 100B, and the bottom dummy region 100C may be the same as or similar to those described above with respect to FIG. 23A. Although FIG. 27 illustrates two pairs of conductive lines 72 and dielectric layers 52 in the top dummy region 100A, two pairs of conductive lines 72 and dielectric layers 52 in the bottom dummy region 100C, and seven pairs of conductive lines 72 and dielectric layers 52 in the functional memory cell region 100B, any number of pairs of the conductive lines 72 and the dielectric layers 52 may be included in each of the top dummy region 100A, the functional memory cell region 100B, and the bottom dummy region 100C.

Maintaining the thicknesses of the top dummy region 100A, the functional memory cell region 100B, and the bottom dummy region 100C in the above-described ranges ensures that the memory cells 202 are formed with reduced variations, while maintaining the area in which the memory cells 202 are formed. Continuing the staircase structure into the top dummy region 100A and the bottom dummy region 100C provides greater isolation for the conductive lines 72 in the top dummy region 100A and the bottom dummy region 100C.

Embodiments may achieve advantages. For example, forming a memory array which includes dummy regions adjacent portions of conductive lines, FE materials, and OS layers which have tapered sidewalls and forming active regions adjacent portions of the conductive lines, the FE materials, and the OS layers which have vertical sidewalls reduces variations between memory cells formed in various layers over the memory array, reduces device defects, and results in improved performance.

In accordance with an embodiment, a memory array includes a ferroelectric (FE) material over a semiconductor substrate, the FE material including vertical sidewalls in contact with a word line; an oxide semiconductor (OS) layer over the FE material, the OS layer contacting a source line and a bit line, the FE material being between the OS layer and the word line; a transistor including a portion of the FE material, a portion of the word line, a portion of the OS layer, a portion of the source line, and a portion of the bit line; and a first dummy word line between the transistor and the semiconductor substrate, the FE material further including first tapered sidewalls in contact with the first dummy word line. In an embodiment, the memory array further includes a second dummy word line over the transistor, the transistor being between the second dummy word line and the semiconductor substrate, the FE material further including second tapered sidewalls in contact with the second dummy word line. In an embodiment, a distance between opposite sidewalls of the second tapered sidewalls of the FE material decreases in a direction toward the semiconductor substrate. In an embodiment, a distance between opposite sidewalls of the first tapered sidewalls of the FE material decreases in a direction toward the semiconductor substrate. In an embodiment, the memory array further includes a functional memory cell region including the word line and the transistor; and a first dummy region between the functional memory cell region and the semiconductor substrate, the first dummy region including the first dummy word line, a ratio of a thickness of the first dummy region in a first direction perpendicular to a major surface of the semiconductor substrate to a thickness of the functional memory cell region in the first direction being from 0.01 to 0.6. In an embodiment, the word line has a first length in a second direction parallel to a major surface of the semiconductor substrate, the first dummy word line has a second length in the second direction, and the second length is greater than the first length. In an embodiment, the memory array further includes a second dummy word line between the first dummy word line and the semiconductor substrate, the second dummy word line having a third length in the second direction equal to the second length.

In accordance with another embodiment, a memory array includes one or more lower dummy word lines over a semiconductor substrate; one or more word lines over the lower dummy word lines; one or more upper dummy word lines over the word lines; a source line extending through the lower dummy word lines, the word lines, and the upper dummy word lines; a bit line extending through the lower dummy word lines, the word lines, and the upper dummy word lines; and one or more transistors, each of the transistors including a portion of one of the word lines, a portion of the source line, and a portion of the bit line, the upper dummy word lines having widths less than widths of the word lines, and the upper dummy word lines having lengths less than lengths of the word lines. In an embodiment, the widths of the word lines are less than widths of the lower dummy word lines, and the lengths of the word lines are less than lengths of the lower dummy word lines. In an embodiment, portions of the bit line and the source line extending through the lower dummy word lines and the upper dummy word lines have tapered sidewalls. In an embodiment, portions of the bit line and the source line extending through the word lines have vertical sidewalls. In an embodiment, the memory array further includes a lower dummy region, a functional memory cell region over the lower dummy region, and an upper dummy region over the functional memory cell region, the lower dummy word lines being disposed in the lower dummy region, the word lines and the one or more transistors being disposed in the functional memory cell region, the upper dummy word lines being disposed in the upper dummy region, a ratio of a first thickness of the lower dummy region to a second thickness of the functional memory cell region being from 0.01 to 0.6, and a ratio of a third thickness of the upper dummy region to the second thickness being from 0.01 to 0.6. In an embodiment, the lower dummy word lines include a first dummy word line and a second dummy word line, the second dummy word line being further from the semiconductor substrate than the first dummy word line, the second dummy word line having a length equal to a length of the first dummy word line. In an embodiment, the lower dummy word lines include a first dummy word line and a second dummy word line, the second dummy word line being further from the semiconductor substrate than the first dummy word line, the second dummy word line having a length less than a length of the first dummy word line.

In accordance with yet another embodiment, a method includes forming a multi-layer stack over a semiconductor substrate, the multi-layer stack including alternating conductive layers and dielectric layers; patterning a first trench extending through the multi-layer stack, a first portion of the first trench proximal the semiconductor substrate having first tapered sidewalls, a second portion of the first trench having vertical sidewalls, a third portion of the first trench distal the semiconductor substrate having second tapered sidewalls, the vertical sidewalls extending from the first tapered sidewalls to the second tapered sidewalls, patterning the first trench defining bottom dummy word lines adjacent the first portion, word lines adjacent the second portion, and top dummy word lines adjacent the third portion; depositing a ferroelectric (FE) material along the first tapered sidewalls, the vertical sidewalls, the second tapered sidewalls, and a bottom surface of the first trench; depositing an oxide semiconductor (OS) layer over the FE material, first portions of the OS layer, first portions of the FE material, and portions of the bottom dummy word lines forming one or more dummy transistors, and second portions of the OS layer, second portions of the FE material, and portions of the word line forming one or more transistors; patterning the multi-layer stack such that the conductive layers and the dielectric layers have a staircase shape in a cross-sectional view; and forming conductive lines electrically coupled to the one or more transistors. In an embodiment, widths between opposite sidewalls of the first tapered sidewalls and the second tapered sidewalls narrow in a direction towards the semiconductor substrate. In an embodiment, the bottom dummy word lines are patterned with lengths equal to a length of a bottommost word line of the word lines. In an embodiment, a bottommost word line of the word lines is patterned to a first length, a topmost bottom dummy word line of the bottom dummy word lines is patterned to a second length, and a bottommost bottom dummy word line of the bottom dummy word lines is patterned to a third length, the third length being greater than the second length, and the second length being greater than the first length. In an embodiment, a topmost word line of the word lines is patterned to a first length, a bottommost top dummy word line of the top dummy word lines is patterned to a second length, and a topmost top dummy word line of the top dummy word lines is patterned to a third length, the first length being greater than the second length, and the second length being greater than the third length. In an embodiment, the first portion has a first height, the second portion has a second height, the third portion has a third height, a ratio of the first height to the second height is from 0.01 to 0.6, and a ratio of the third height to the second height is from 0.01 to 0.6.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:

a ferroelectric (FE) material over a semiconductor substrate, the FE material comprising vertical sidewalls in contact with a word line;

an oxide semiconductor (OS) layer over the FE material, the OS layer contacting a source line and a bit line, wherein the FE material is between the OS layer and the word line;

a transistor comprising a portion of the FE material, a portion of the word line, a portion of the OS layer, a portion of the source line, and a portion of the bit line; and a first dummy word line between the transistor and the semiconductor substrate, wherein the FE material further comprises first tapered sidewalls in contact with the first dummy word line, wherein a slope of a sidewall the portion of the FE material adjacent the portion of the word line is different than a slope of the first tapered sidewalls of the FE material.

2. The memory array of claim 1, further comprising a second dummy word line over the transistor, the transistor being between the second dummy word line and the semiconductor substrate, wherein the FE material further comprises second tapered sidewalls in contact with the second dummy word line.

3. The memory array of claim 2, wherein a distance between opposite sidewalls of the second tapered sidewalls of the FE material decreases in a direction toward the semiconductor substrate.

4. The memory array of claim 1, wherein a distance between opposite sidewalls of the first tapered sidewalls of the FE material decreases in a direction toward the semiconductor substrate.

5. The memory array of claim 1, further comprising:

a functional memory cell region comprising the word line and the transistor; and a first dummy region between the functional memory cell region and the semiconductor substrate, the first dummy region comprising the first dummy word line, wherein a ratio of a thickness of the first dummy region in a first direction perpendicular to a major surface of the semiconductor substrate to a thickness of the functional memory cell region in the first direction is from 0.01 to 0.6.

6. The memory array of claim 1, wherein the word line has a first length in a second direction parallel to a major surface of the semiconductor substrate, wherein the first dummy word line has a second length in the second direction, and wherein the second length is greater than the first length.

7. The memory array of claim 6, further comprising a second dummy word line between the first dummy word line and the semiconductor substrate, the second dummy word line having a third length in the second direction equal to the second length.

8. A memory array comprising:

one or more lower dummy word lines over a semiconductor substrate;

one or more word lines over the lower dummy word lines;

one or more upper dummy word lines over the word lines;

a source line extending through the lower dummy word lines, the word lines, and the upper dummy word lines;

a bit line extending through the lower dummy word lines, the word lines, and the upper dummy word lines; and one or more transistors, each of the transistors comprising a portion of one of the word lines, a portion of the source line, and a portion of the bit line, wherein the upper dummy word lines have widths less than widths of the word lines, and wherein the upper dummy word lines have lengths less than lengths of the word lines.

9. The memory array of claim 8, wherein the widths of the word lines are less than widths of the lower dummy word lines, and wherein the lengths of the word lines are less than lengths of the lower dummy word lines.

10. The memory array of claim 8, wherein portions of the bit line and the source line extending through the lower dummy word lines and the upper dummy word lines have tapered sidewalls.

11. The memory array of claim 10, wherein portions of the bit line and the source line extending through the word lines have vertical sidewalls.

12. The memory array of claim 8, further comprising a lower dummy region, a functional memory cell region over the lower dummy region, and an upper dummy region over the functional memory cell region, wherein the lower dummy word lines are disposed in the lower dummy region, wherein the word lines and the one or more transistors are disposed in the functional memory cell region, wherein the upper dummy word lines are disposed in the upper dummy region, wherein a ratio of a first thickness of the lower dummy region to a second thickness of the functional memory cell region is from 0.01 to 0.6, and wherein a ratio of a third thickness of the upper dummy region to the second thickness is from 0.01 to 0.6.

13. The memory array of claim 8, wherein the lower dummy word lines comprise a first dummy word line and a second dummy word line, the second dummy word line being further from the semiconductor substrate than the first dummy word line, the second dummy word line having a length equal to a length of the first dummy word line.

14. The memory array of claim 8, wherein the lower dummy word lines comprise a first dummy word line and a second dummy word line, the second dummy word line being further from the semiconductor substrate than the first dummy word line, the second dummy word line having a length less than a length of the first dummy word line.

15. A memory array comprising:

a plurality of first dummy word lines on a semiconductor substrate;

a plurality of first word lines on the first dummy word lines;

a plurality of second dummy word lines on the first word lines;

a ferroelectric (FE) material extending along side surfaces of the first dummy word lines, the first word lines, and the second dummy word lines, wherein the FE material has first tapered sidewalls extending along the side surfaces of the first dummy word lines, wherein the FE material has vertical sidewalls extending along the side surfaces of the first word lines, and wherein the FE material has second tapered sidewalls extending along the side surfaces of the second dummy word lines; and an oxide semiconductor (OS) layer on the FE material.

16. The memory array of claim 15, further comprising:

a plurality of dummy transistors, the dummy transistors comprising first portions of the OS layer, first portions of the FE material, and portions of the first dummy word lines; and a plurality of transistors, the transistors comprising second portions of the OS layer, second portions of the FE material, and portions of the first word lines.

17. The memory array of claim 15, wherein the first tapered sidewalls and the second tapered sidewalls narrow in a direction towards the semiconductor substrate.

18. The memory array of claim 15, wherein the first dummy word lines have first lengths equal to a second length of a bottommost first word line of the first word lines.

19. The memory array of claim 15, wherein a bottommost first word line of the first word lines has a first length, wherein a topmost first dummy word line of the first dummy word lines has a second length, wherein a bottommost first dummy word line of the first dummy word lines has a third length, wherein the third length is greater than the second length, and wherein the second length is greater than the first length.

20. The memory array of claim 15, wherein a topmost first word line of the first word lines has a first length, wherein a bottommost second dummy word line of the second dummy word lines has a second length, wherein a topmost second dummy word line of the second dummy word lines has a third length, wherein the first length is greater than the second length, and wherein the second length is greater than the third length.

* * * * *